(12) United States Patent
Koga

(10) Patent No.: US 7,796,419 B2
(45) Date of Patent: Sep. 14, 2010

(54) MAGNETIC MEMORY

(75) Inventor: Keiji Koga, Tokyo (JP)

(73) Assignee: TDK Corporation, Tokyo (JP)

( * ) Notice: Subject to any disclaimer, the term of this patent is extended or adjusted under 35 U.S.C. 154(b) by 280 days.

(21) Appl. No.: 11/605,465

(22) Filed: Nov. 29, 2006

(65) Prior Publication Data

US 2007/0121373 A1    May 31, 2007

(30) Foreign Application Priority Data

Nov. 30, 2005   (JP)   ............................ P2005-346132

(51) Int. Cl.
*G11C 11/00* (2006.01)
(52) U.S. Cl. .................. 365/158; 365/171; 365/173
(58) Field of Classification Search .................. 365/158, 365/171, 173, 189.04, 225.5, 189.01, 104, 365/145
See application file for complete search history.

(56) References Cited

U.S. PATENT DOCUMENTS

| | | | |
|---|---|---|---|
| 5,343,422 A | 8/1994 | Kung et al. | |
| 5,629,922 A | 5/1997 | Moodera et al. | |
| 6,714,444 B2 * | 3/2004 | Huai et al. .................. | 365/171 |
| 6,930,911 B2 | 8/2005 | Ezaki et al. | |
| 7,016,221 B2 | 3/2006 | Ezaki et al. | |
| 7,154,798 B2 * | 12/2006 | Lin et al. .................. | 365/209 |
| 7,157,760 B2 * | 1/2007 | Kamijima .................. | 257/295 |
| 7,166,881 B2 * | 1/2007 | Lin et al. .................. | 257/295 |
| 7,190,613 B2 * | 3/2007 | Nagase et al. ................ | 365/171 |
| 7,209,380 B2 | 4/2007 | Ezaki et al. | |
| 7,227,771 B2 | 6/2007 | Ezaki et al. | |
| 7,230,843 B2 | 6/2007 | Ezaki et al. | |
| 7,295,460 B2 | 11/2007 | Ezaki et al. | |
| 7,332,781 B2 * | 2/2008 | Nozieres et al. .............. | 257/422 |

FOREIGN PATENT DOCUMENTS

JP         A 09-091949        4/1997

OTHER PUBLICATIONS

Jeong, et al; (2005); "Highly scalable MRAM using field assisted current induced switching"; Symposium on VLSI Technology Digest of Technical Papers; pp. 184-185.
(2005); Proceedings of the 29*th* Annual Conference on Magnetics in Japan; pp. 183.

* cited by examiner

*Primary Examiner*—Dang T Nguyen
(74) *Attorney, Agent, or Firm*—Oliff & Berridge, Plc

(57) ABSTRACT

The magnetic fields generated by the electric current flowing through the respective lines are pulled into a magnetic yoke whereby the magnetic fields are concentrated on a magnetoresistive element including the magnetosensitive layer. Namely, the opposite magnetic fields are brought close to each other in the magnetosensitive layer in reading of information to cancel each other efficiently.

16 Claims, 23 Drawing Sheets

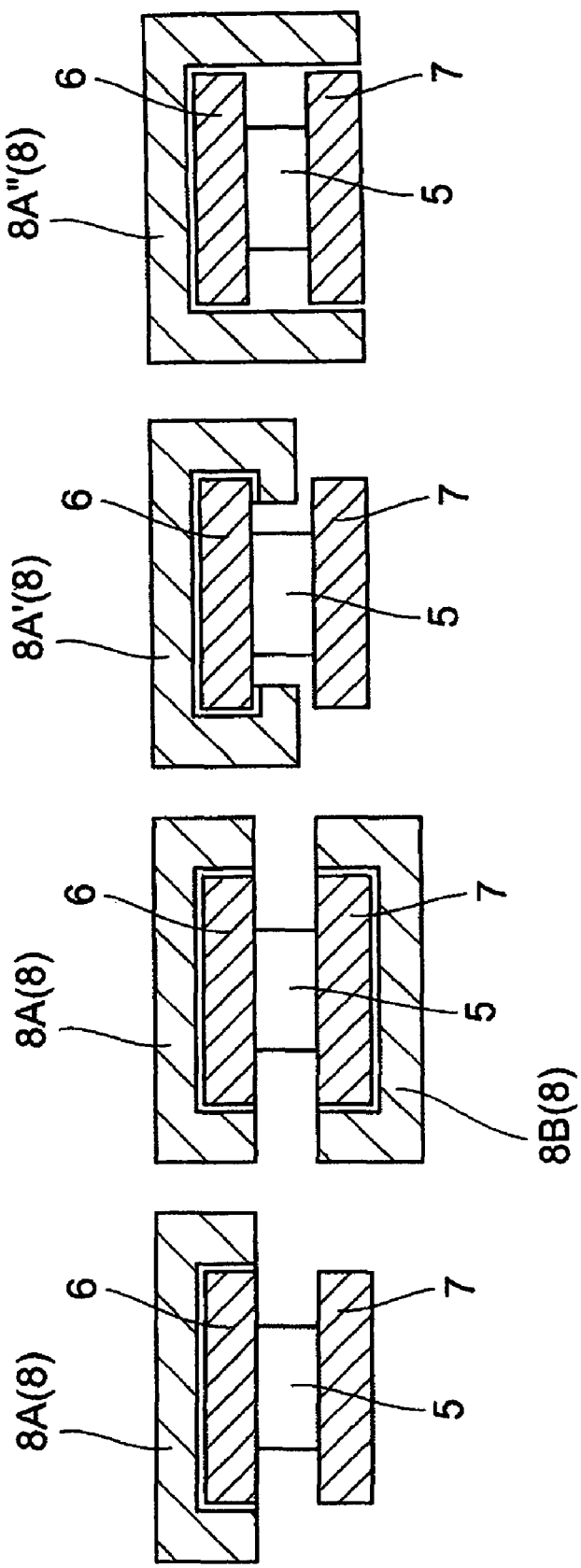

Fig.5
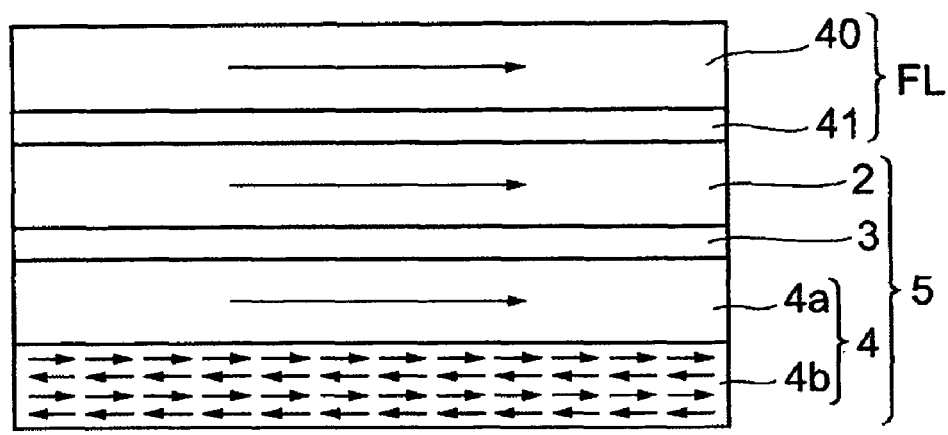
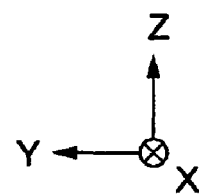

MAGNETIC MEMORY

BACKGROUND OF THE INVENTION

1. Field of the Invention

The present invention relates to a magnetic memory.

2. Related Background Art

Currently, volatile memories such as DRAMs and SRAMs are used as general-purpose memories in information processing equipment such as computers and communication devices. With the volatile memories such as DRAMs, however, it is necessary to constantly supply electric current, e.g., to perform refresh for maintaining stored information, and the whole information will be lost if the power supply is shut off. For this reason, it becomes necessary to provide a means for storing the information, i.e., to provide an additional nonvolatile memory, e.g., a flash EEPROM or a hard disk drive used currently. An important subject for these nonvolatile memories is to increase speed of access with increase in speed of information processing.

These nonvolatile memories, however, are not yet quite satisfactory in terms of access speed, reliability, power consumption, and so on.

Furthermore, rapid spread and enhancement of performance of portable information equipment induced rapid development of information equipment aimed at so-called ubiquitous computing, which permits information processing anytime and anywhere. There are strong demands for development of highly-reliable, high-speed, large-capacity nonvolatile memories as key devices in development of such equipment.

A promising technology effective to increase in speed of the nonvolatile memory is an MRAM Magnetic Random Access Memory) in which magnetic thin-film elements for storing information by directions of magnetizations along an axis of easy magnetization of a ferromagnetic layer are arrayed in a matrix. In the MRAM, information is stored based on directions of magnetizations of two ferromagnets. A magnetization reversing speed of a fine ferromagnet is said to be 2 nsec or less, and thus the MRAM can be a high-speed memory. For reading stored information, a direction of magnetization of a magnetosensitive layer becomes parallel or antiparallel to a direction of reference magnetization to cause a resistance difference and it is detected as a change of electric current or voltage.

The MRAMs include those utilizing the Giant Magnetoresistance (GMR) effect. One of the known MRAMs utilizing the GMR effect is the one described in U.S. Pat. No. 5,343, 422. The GMR effect is a phenomenon in which the resistance is minimum when magnetization directions of two magnetic layers parallel to the axis of easy magnetization are parallel and in which the resistance is maximum when the magnetization directions of the two magnetic layers are antiparallel. The MRAMs utilizing the GMR effect include those of a Pseudo spin valve type to write/read information by making use of a difference between retentive forces of two ferromagnets, and those of a Spin Valve type including a fixed layer in which a magnetization direction thereof is fixed by antiferromagnetic coupling to an antiferromagnetic layer with a nonmagnetic layer in between, and a free layer in which a magnetization direction thereof varies depending upon an external magnetic field.

In the MRAMs utilizing the GMR effect, a change in resistance is read as a change of electric current or voltage. In either case, information is written by a method of reversing the magnetization direction of the magnetic layer by an induced magnetic field (current magnetic field) by electric current flowing through wiring.

For further improvement in the resistance change in the GMR, there are proposals on MRAMs utilizing the Tunnel Magnetoresistance (TMR) effect. The TMR effect is a phenomenon in which a tunnel current flowing through an insulating layer varies depending upon a relative angle between magnetization directions of two ferromagnetic layers placed with the thin insulating layer in between. The resistance is minimum when the magnetization directions are parallel; the resistance is maximum when they are antiparallel. In the TMR, for example, CoFe/Al oxide/CoFe demonstrates a large resistance change rate of 40% or more, and high resistance, and thus permits easy impedance matching in combination with semiconductor devices such as MOS-FETs. For this reason, the TMR permits easier achievement of high output than the GMR, and is expected to achieve increase in storage capacity and access speed. The MRAMs utilizing the TMR effect are described in U.S. Pat. No. 5,629,922 and Japanese Patent Application Laid-Open No. 9-91949.

The MRAMs utilizing the TMR effect adopt a method of storing information by changing a direction of magnetization of a magnetic film to a predetermined direction by a current magnetic field of wiring. A method for reading stored information is a method of reading information by letting an electric current flow perpendicularly to an insulating layer and detecting a change in resistance of a thin-film magnetic element.

Many MRAMs have a structure in which TMR elements are located at intersections between bit lines and word lines routed in a lattice pattern. A normal TMR element has a three-layer structure of ferromagnetic layer/nonmagnetic insulating layer/ferromagnetic layer having a nonmagnetic layer between two ferromagnetic layers. The ferromagnetic layers are normally comprised of a transition metal magnetic element (Fe, Co, Ni) or an alloy of transition metal magnetic elements (CoFe, CoFeNi, NiFe, etc.) in the thickness of 10 nm or less, and the nonmagnetic insulating layer is comprised of $Al_2O_3$, MgO, or the like.

The direction of magnetization is fixed in one ferromagnetic layer (fixed layer) forming the TMR element, and the direction of magnetization rotates according to the external magnetic field in the other ferromagnetic layer (magnetosensitive layer or free layer). A structure of the fixed layer frequently used is the exchange coupling type in which an antiferromagnetic layer (FeMn, IrMn, PtMn, NiMn, or the like) is given to the one ferromagnetic layer.

Memory information "1" or "0" is defined according to a state of directions of magnetizations of the two ferromagnetics forming the TMR element, i.e., depending upon whether the directions of magnetizations are parallel or antiparallel. The value of electric resistance in the thickness direction is larger in an antiparallel state of the magnetization directions of the two ferromagnetics than in a parallel state of the magnetization directions.

Therefore, the information "1" or "0" is read by letting an electric current flow in the thickness direction of the TMR element and measuring a resistance or an electric current value of the TMR element by MR (magnetoresistance) effect.

The conventional method of writing the information "1" or "0" is to rotate the direction of magnetization of the magnetosensitive layer in the TMR element by action of magnetic fields created by flow of electric current through lines located near the TMR element.

In a case where elements are highly integrated to realize a high-density memory, the magnetoresistive elements are micronized to reduce a ratio of length and thickness of the magnetic layers, and this increases a demagnetizing field and results in increasing the intensity of the magnetic field for changing the magnetization direction of the magnet and requiring a large writing current.

Known technologies for reducing the wiring current include a magnetization reversing method of applying a magnetic field to the magnet in a writing operation of changing the magnetization direction of the magnetosensitive layer corresponding to the information "1" or "0," and spin injection magnetization reversal using spin transfer torque by spin polarized current.

A general reading method of information is a method of providing each cell with a read select transistor, bringing only the read transistor of a selected cell into a conduction state, and reading a resistance of the magnetoresistive element of the selected cell.

The spin transfer torque is a torque that changes the magnetization direction of the other ferromagnet when an electric current is allowed to flow from one ferromagnet through the nonmagnetic layer to the other ferromagnet. By controlling a spin direction of the injected current, therefore, it becomes feasible to change the magnetization direction of the other magnet.

For example, when an electric current is allowed to flow in a direction perpendicular to a film surface of a laminate consisting of microscopic ferromagnetic layer/nonmagnetic layer/ferromagnetic layer, reversal of magnetization of the ferromagnet takes place. This phenomenon is called spin injection magnetization reversal, and occurs as follows: there is a difference between energy states of electrons with upward spins (up spins) and electrons with downward spins (down spins) at the junction between the ferromagnetic layer and the nonmagnetic layer and this difference causes differences of transmittance and reflectance of up-spin and down-spin electrons, resulting in flow of a spin polarized current.

Spin-polarized electrons of the spin polarized current flowing into the ferromagnetic layer exchange-interact with electrons in the ferromagnetic layer to generate a torque between the electrons, which causes magnetization reversal. This is the magnetization reversal induced by the electric current inside the magnet, different from magnetization reversal induced by the open current magnetic field; therefore, there is little influence on adjacent cells, the writing current is unlikely to increase with micronization of elements, and, conversely, the writing current can be reduced with micronization of elements. When the spin injection magnetization reversal is used as a method of recording information, a high-density magnetic memory can be realized accordingly.

The known methods of changing the direction of magnetization of the ferromagnet by making use of the spin transfer torque include (I) Relaxing Switching method, (II) Precessional Switching method, (III) Relaxing-Precessional Switching method, and so on.

In the relaxing switching method, the direction of magnetization of the magnetosensitive layer is controlled by the spin transfer torque from the fixed layer, and the direction of magnetization of the fixed layer is within the film surface and is parallel to the axis of easy magnetization of the magnetosensitive layer. For reversing the direction of magnetization of the magnetosensitive layer, therefore, the spin transfer torque competes with Spin Relaxing acting to direct the magnetization into the effective magnetic field direction, in an initial stage of reversal. Since the spin transfer torque is small in the initial stage of reversal where the direction of magnetization of the magnetosensitive layer is nearly parallel to the direction of magnetization of the fixed layer, the reversal takes some time. Namely, in the relaxing switching method, the direction of magnetization is gradually changed into an equilibrium state against these forces, and a large electric current is thus needed in order to reverse the direction of magnetization. The magnitude of the spin transfer torque necessary for the magnetization reversal is proportional to the Gilbert attenuation constant in the LLG (Landau-Lifshitz-Gilbert) equation.

In the precessional switching method, the direction of magnetization of the magnetosensitive layer is controlled by the spin transfer torque from the fixed layer, and the direction of magnetization of the fixed layer is perpendicular to the film surface and perpendicular to the axis of easy magnetization of the magnetosensitive layer. The spin transfer torque causes the direction of magnetization of the magnetosensitive layer to have a perpendicular component to the film surface and the demagnetizing field causes the magnetization to rotate into another direction within the film surface. Since the spin transfer torque is constant even after rotation of the magnetization of the magnetosensitive layer in the film surface, the magnetization reversal can be achieved within a short period of time. However, since the spin transfer torque acts even after the magnetization reversal of the magnetosensitive layer as long as the electric current flows, the magnetization of the magnetosensitive layer is again reversed depending upon a time of application of the electric current. Therefore, this method requires a very precise time control of electric current.

The relaxing-precessional switching method was thus proposed and is to apply an external magnetic field in a direction of an axis of hard magnetization of the magnetosensitive layer in the precessional switching method. This method does not require the precise time control of electric current as required in the precessional switching method, but requires precise control of the spin transfer torque.

The magnetic memories as described above are described, for example, in W. C. Jeong, J. H. Park, J. H. Oh, G T. Jeong, H. S. Jeong and Kinam Kim, "Highly scalable MRAM using filed assisted current induced switching," Symposium on VLSI Technology Digest of Technical Papers, p. 184-185, 2005 and Hiroshi Morise and Shiho Nakamura "Proceedings of The 29 th Annual Conference on Magnetics in Japan," p183, 2005.

SUMMARY OF THE INVENTION

In the conventional magnetic memories, however, while the magnetic fields generated by electric current flowing in the lines assist the magnetization reversal of the magnetosensitive layer by spin injection, the magnetic fields from the lines also affect the direction of magnetization during reading of information. Therefore, the reading current as a magnetic field source has to be lowered so as not to induce the magnetization reversal by the electric current, and there is thus a problem that the conventional magnetic memories lack reliability in reading of information.

The present invention has been accomplished in view of the above problem and an object of the invention is to provide a magnetic memory capable of achieving improvement in reliability.

In order to solve the above problem, a magnetic memory according to the present invention is a magnetic memory consisting of an array of storage areas, wherein each of the storage areas comprises: a first line; a second line; a magnetoresistive element disposed between a midway of the first line and the second line and electrically connected to the midway of the first line and to the second line; and a spin filter prepared for the magnetoresistive element, so as to change a direction of magnetization of a magnetosensitive layer in the magnetoresistive element by spin injection.

When an electric current is allowed to flow between the midway of the first line and the second line, magnetic fields are generated so as to surround the respective lines. The first and second lines are so arranged that in writing of information, directions of the electric current flowing in the first line and in the second line are opposite to each other and the magnetic fields around the first line and around the second line both assist a force to change the direction of magnetization of the magnetosensitive layer by spin injection.

In writing of information, therefore, the direction of magnetization of the magnetosensitive layer is readily changed by the assist force of the magnetic fields established by the electric current flowing in the first and second lines, in addition to the force of changing the direction of magnetization upon spin injection.

Furthermore, the first and second lines are so arranged that in reading of information, directions of the electric current flowing in the first line and in the second line are coincident with each other and magnetic fields around the first line and around the second line cancel each other in the magnetosensitive layer. In reading of information, therefore, the two magnetic fields cancel each other, so as to weaken the force of changing the direction of magnetization of the magnetosensitive layer, and therefore the magnetization reversal of the magnetosensitive layer is not induced even by mixing of noise or by increase of the reading current, so as to enhance the reliability of the magnetic memory.

The magnetic fields generated by the flow of the electric current through the first line and through the second line are generated approximately in the same plane, but, precisely, they deviate from each other along the longitudinal direction of the lines. Namely, the cancellation of the magnetic fields in the magnetosensitive layer is not complete. Therefore, preferably, each storage area comprises a magnetic yoke surrounding the magnetoresistive element. In this case, each magnetic field generated by flow of the electric current through each line is pulled into the magnetic yoke, whereby the magnetic fields are concentrated on the magnetoresistive element including the magnetosensitive layer. Namely, the magnetic fields are brought close to each other in the magnetosensitive layer in reading of information to efficiently implement the cancellation.

Preferably, the magnetoresistive element is a TMR element comprising an insulating layer between the magnetosensitive layer and a first fixed layer. The TMR element is an element making use of a phenomenon in which a ratio of electrons tunneling through the insulating layer as a tunnel barrier layer during reading differs according to a difference between a direction of stored magnetization in the magnetosensitive layer and a direction of magnetization in the first fixed layer, and permits highly-sensitive detection of stored information.

Preferably, the first and second lines extend in a direction perpendicular to both of the direction of magnetization of the fixed layer and the thickness direction thereof, at the position of the magnetoresistive element. Namely, since a direction around the longitudinal direction of the first and second lines coincides with the direction of magnetization of the fixed layer at the position of the magnetosensitive layer, the magnetic fields can effectively assist a change in the direction of magnetization upon passage of electricity through the first and second lines in writing of information.

Preferably, the spin filter comprises: a nonmagnetic, electroconductive layer disposed on the magnetosensitive layer, and a second fixed layer in contact with the nonmagnetic, electroconductive layer, and a direction of an axis of easy magnetization of the second fixed layer is parallel to a direction of an axis of easy magnetization of the first fixed layer. In this case, as electrons are injected into the magnetosensitive layer, a spin-polarized current whose spin is polarized along a certain direction is injected into the magnetosensitive layer to reverse magnetization by interaction with electrons in the magnetosensitive layer.

The present invention successfully provides the magnetic memory capable of achieving improvement in reliability.

BRIEF DESCRIPTION OF THE DRAWINGS

FIG. 4A is a vertical sectional view of respective storage regions with a magnetic yoke.

FIG. 4B is a vertical sectional view of respective storage regions with a magnetic yoke.

FIG. 4C is a vertical sectional view of respective storage regions with a magnetic yoke.

FIG. 4D is a vertical sectional view of respective storage regions with a magnetic yoke.

FIG. 5 is a view showing a vertical sectional configuration of an element main part including the magnetoresistive element 5.

DESCRIPTION OF THE PREFERRED EMBODIMENT

A magnetic memory according to an embodiment will be described below. The same elements will be denoted by the same reference symbols, without redundant description. The magnetic memory of the embodiment consists of an array of storage areas P(X, Y) arranged in a matrix of X columns and Y rows, and each storage area P(X, Y) has a magnetoresistive element 5.

Figure 1:
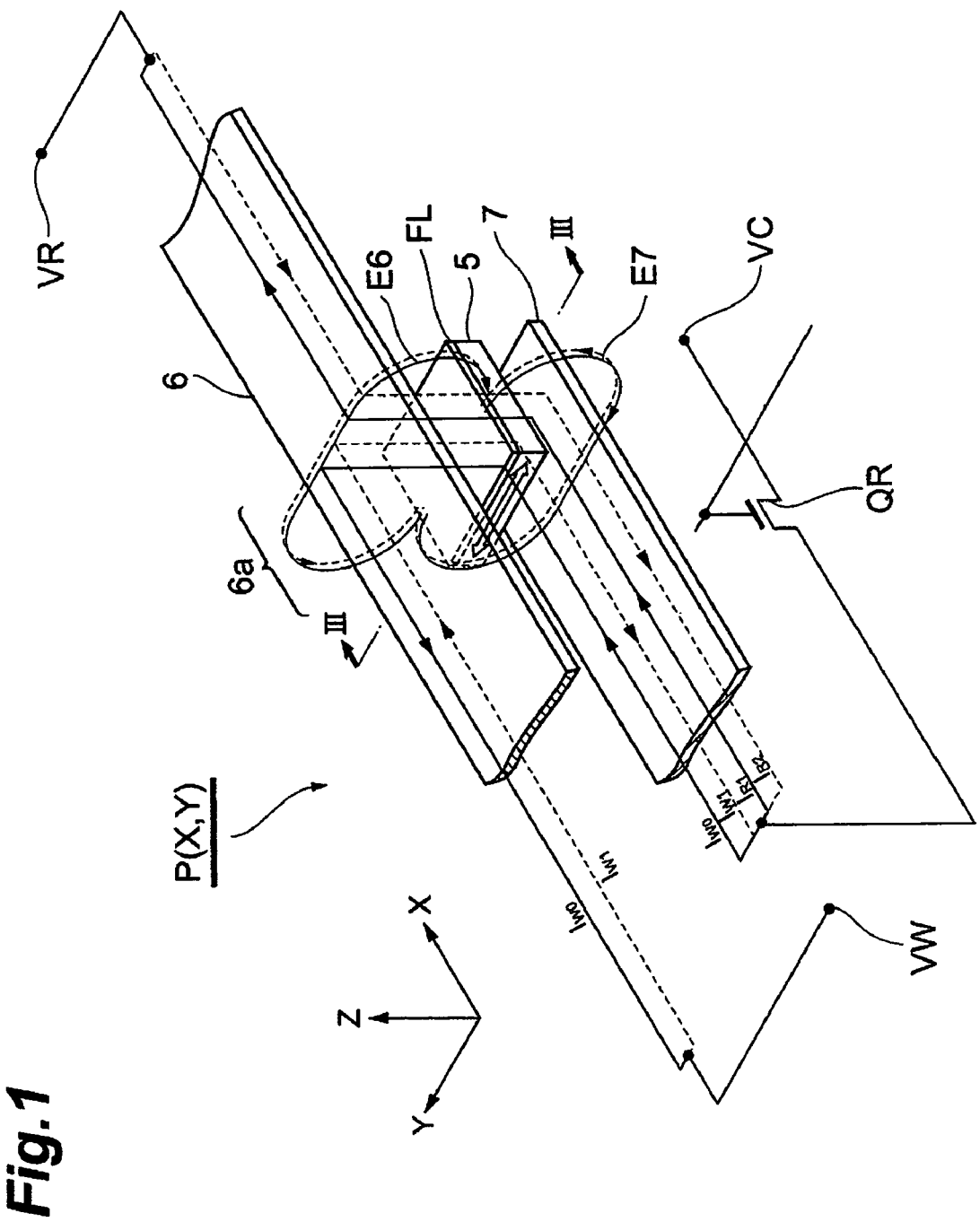
FIG. 1 is a perspective view of a storage area P(X, Y).

FIG. 1 is a perspective view of one storage area P(X, Y).

Each storage area P(X, Y) is comprised of a first line 6, a second line 7, a magnetoresistive element 5 disposed between a midway 6a of the first line 6 and the second line 7 and electrically connected to the midway 6a of the first line 6 and to the second line 7, and a spin filter FL prepared for the magnetoresistive element 5, so as to change a direction of magnetization of a magnetosensitive layer in the magnetoresistive element 5 by spin injection.

The first line 6 extends along the X-axis and the second line 7 also extends along the X-axis. The transverse direction of each line 6, 7 is parallel to the Y-axis and the thickness direction is parallel to the Z-axis.

When an electric current is allowed to flow between the midway 6a of the first line 6 and the second line 7, magnetic fields E6, E7 are generated so as to surround the respective lines 6, 7. Namely, the magnetic fields E6, E7 are generated so as to surround the X-axis and directions thereof are approximately parallel to the Y-axis at the position of the magnetosensitive layer in the magnetoresistive element 5.

The two ends of the first line 6 are connected to a terminal VW and to a terminal VR, respectively, one end of the second line 7 is connected to a terminal VC, and the other end of the second line 7 to a bottom surface of the magnetoresistive element 5. A switch (a field effect transistor) QR is interposed between the one end of the second line 7 and the terminal VC.

The terminal VW for writing of information is opened in reading of information.

When in the open state of the writing terminal VW a potential of the terminal VC is raised relative to a potential of the reading terminal VR and the switch QR is turned on, an information read current $I_{R1}$ flows from the terminal VC of the second line 7 through the magnetoresistive element 5 to the reading terminal VR of the first line 6 to generate the magnetic field E6 and magnetic field E7 in the same direction of rotation. The magnetic field E6 and magnetic field E7 in reading of information both are clockwise with respect to a direction of travel along the positive direction of the X-axis. Therefore, the magnetic fields E6, E7 cancel each other at the position of the magnetoresistive element 5 located between these lines.

On the other hand, when in the open state of the writing terminal VW the potential of the terminal VC is lowered relative to the potential of the reading terminal VR and the switch QR is turned on, an information read current $I_{R2}$ flows from the reading terminal VR of the first line 6 through the magnetoresistive element 5 to the terminal VC of the second line 7 to generate the magnetic field E6 and magnetic field E7 in the same direction of rotation. The magnetic field E6 and magnetic field E7 in reading of information both are clockwise with respect to a direction of travel along the negative direction of the X-axis. Therefore, the magnetic fields E6, E7 cancel each other at the position of the magnetoresistive element 5 located between these lines.

As described above, the first and second lines are so arranged that in reading of information the reading current $I_{R1}$, $I_{R2}$ flows in the same direction through the first line 6 and through the second line 7 and the magnetic fields E6, E7 around the first line 6 and around the second line 7 cancel each other in the magnetosensitive layer of the magnetoresistive element 5. Since the two magnetic fields E6, E7 cancel each other in reading of information, the force of changing the direction of magnetization of the magnetosensitive layer is weak, so that the magnetization of the magnetosensitive layer is not reversed even by mixing of noise or by increase of the read current, which improves the reliability of the magnetic memory.

Conversely, the terminal VR for reading of information is opened in writing of information. When in the open state of the reading terminal VR a potential of the terminal VC is raised relative to a potential of the writing terminal VW and the switch QR is turned on, an information write current $I_{W0}$ flows from the terminal VC of the second line 7 through the magnetoresistive element 5 to the writing terminal VW of the first line 6 to generate the magnetic field E6 and magnetic field E7 in directions of rotation opposite to each other. At this time, the magnetic field E6 in writing of information is clockwise with respect to a direction of travel along the negative direction of the X-axis, while the magnetic field E7 is clockwise with respect to a direction of travel along the positive direction of the X-axis. Therefore, the magnetic fields directed in the negative direction of the Y-axis act on the magnetoresistive element 5 located between these lines.

On the other hand, when in the open state of the reading terminal VR the potential of the terminal VC is lowered relative to the potential of the writing terminal VW and the switch QR is turned on, an information write current $I_{W1}$ flows from the writing terminal VW of the first line 6 through the magnetoresistive element 5 to the terminal VC of the second line 7 to generate the magnetic field E6 and magnetic field E7 in directions of rotation opposite to each other. At this time, the magnetic field E6 in writing of information is clockwise with respect to a direction of travel along the positive direction of the X-axis, while the magnetic field E7 is clockwise with respect to a direction of travel along the negative direction of the X-axis. Therefore, the magnetic fields directed in the positive direction of the Y-axis act on the magnetoresistive element 5 located between these lines.

The first line 6 and the second line 7 are so arranged that in writing of information the electric current $I_{W0}$, $I_{W1}$ flows in opposite directions through the first line 6 and through the second line 7 and the magnetic fields E6, E7 around the first line 6 and around the second line 7 both assist the force to change the direction of magnetization of the magnetosensitive layer by spin injection (spin transfer torque). Certain polarized spins are transmitted or reflected by the spin filter FL to be injected into the magnetosensitive layer to generate a spin transfer torque. Therefore, in writing of information, the direction of magnetization of the magnetosensitive layer is readily changed by the assist force of the magnetic fields E6, E7 caused by the electric current flowing through the first line 6 and through the second line 7, in addition to the force to change the direction of magnetization upon spin injection.

In the magnetoresistive element subject to the spin injection magnetization reversal, the magnetization direction of the ferromagnet is reversed by flow of the electric current in the direction perpendicular to the film surface of the laminate including the ferromagnet. A spin-polarized current flows because of the difference between transmittances of up-spin electrons and down-spin electrons at the junction between the ferromagnetic layer and the nonmagnetic layer. Spin-polarized electrons of the spin-polarized current flowing into the ferromagnetic layer exchange-interact with electrons in the ferromagnetic layer to generate a torque between the electrons, and the torque causes the magnetization reversal. The direction of the magnetization reversal in the ferromagnetic layer is determined by the direction of the write current $I_{W0}$, $I_{W1}$ flowing through the laminate. Therefore, whether the magnetization direction of the ferromagnet is parallel or antiparallel can be controlled by the direction of the electric current, whereby information can be recorded.

Figure 2A:
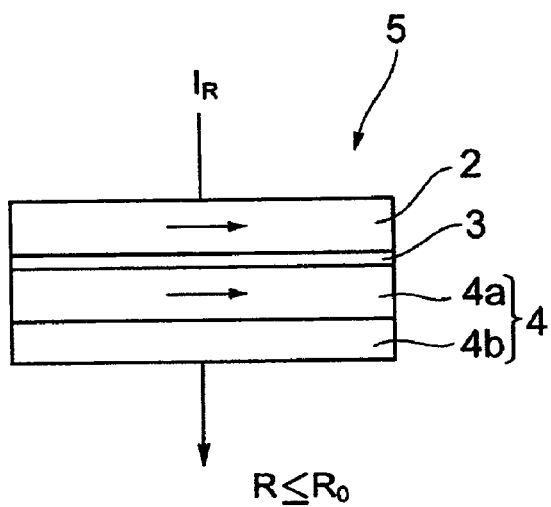
FIG. 2A is a vertical sectional view of a magnetoresistive element 5 (in a parallel state of directions of magnetizations).
Figure 2B:
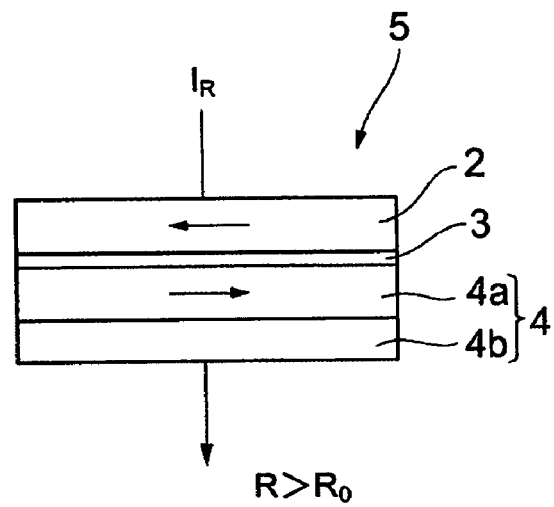
FIG. 2B is a vertical sectional view of a magnetoresistive element 5 (in an antiparallel state of directions of magnetizations).

FIG. 2A is a vertical sectional view of a magnetoresistive element 5 (in which directions of magnetizations are parallel), and FIG. 2B is a vertical sectional view of a magnetoresistive element 5 (in which directions of magnetizations are antiparallel).

The magnetoresistive element 5 has a structure in which an insulating layer 3 constituting a tunnel barrier layer is sandwiched between a magnetosensitive layer 2 and a fixed layer 4. The fixed layer 4 is comprised of a ferromagnetic layer 4a and an antiferromagnetic layer 4b joined to the ferromagnetic layer 4a in order to fix the direction of magnetization thereof, and the magnetoresistive element 5 forms a TMR element. Namely, the magnetoresistive element 5 is a TMR element having the insulating layer 3 between the magnetosensitive layer 2 and the (first) fixed layer 4. The TMR element is an element making use of a phenomenon in which a ratio of electrons passing through the insulating layer 3 as a tunnel barrier layer upon reading differs according to the difference between the direction of magnetization of the magnetosensitive layer 2 in which information is stored, and the direction of magnetization of the fixed layer 4, and is able to implement high-sensitivity detection of stored information.

The spin filter FL shown in FIG. 1 is constructed by joining a fixed layer and a nonmagnetic layer to each other, and this nonmagnetic layer is joined to the magnetosensitive layer 2. Since electrons passing through the spin filter FL are introduced into the TMR element, information can be written or read according to whether the direction of magnetization of the magnetosensitive layer 2 is parallel or antiparallel to the direction of magnetization of the fixed layer 4.

The memory information "1" or "0" is defined according to a state of the directions of magnetizations in the fixed layer 4 and in the magnetosensitive layer 2 constituting the TMR element, i.e., depending upon whether the directions of the magnetizations are parallel (FIG. 2A) or antiparallel (FIG. 2B). The value of electric resistance R in the thickness direction is larger when the directions of magnetizations of the fixed layer 4 and the magnetosensitive layer 2 are antiparallel (FIG. 2B) than when the directions of magnetizations are parallel (FIG. 2B). In other words, the resistance R in the parallel state is not more than a threshold $R_0$, whereas the resistance R in the antiparallel state is larger than the threshold $R_0$. Therefore, the information "1" or "0" is read by letting the electric current $I_R$ ($I_{R1\ or\ IR2}$) flow: in the thickness direction of the TMR element and measuring a resistance or electric current value of the TMR element by MR (magnetoresistance) effect. For example, the parallel state of low resistance is defined as "0," and the antiparallel state of high resistance as "1."

FIGS. 3A, 3B, 3C and 3D are sectional views on arrow along line III-III of the storage part including the magnetoresistive element 5 shown in FIG. 1.

A magnetic yoke 8 is disposed around the magnetoresistive element 5. The magnetic yoke 8 is composed of an upper magnetic yoke 8A of a U-shaped cross section provided around the first line 6, and a lower magnetic yoke 8B of a U-shaped cross section provided around the second line 7, and open ends of the respective magnetic yokes 8A, 8B are opposed to each other.

Figure 3A:
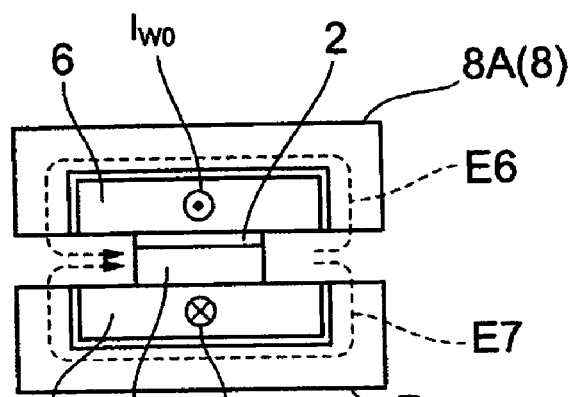
FIG. 3A is a sectional view on arrow along line III-III of a storage part including the magnetoresistive element 5 shown in FIG. 1.

As shown in FIG. 3A, when the write current $I_{W0}$ is allowed to flow through the lines 6, 7, the magnetic fields E6 and E7 are directed approximately in the same direction at the position of the magnetosensitive layer 2 in the magnetoresistive element 5, to enhance each other's intensity.

Figure 3B:
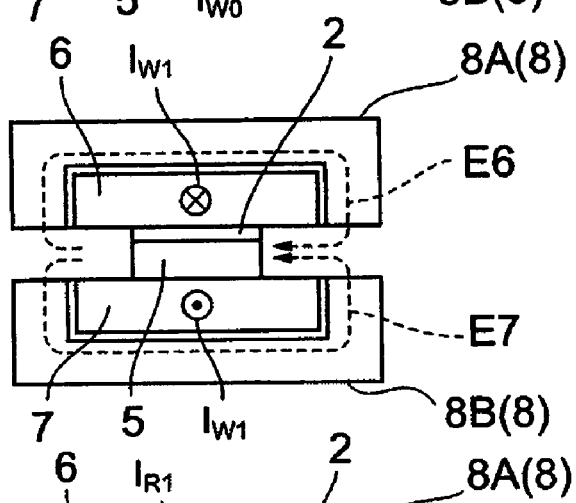
FIG. 3B is a sectional view on arrow along line III-III of a storage part including the magnetoresistive element 5 shown in FIG. 1.

As shown in FIG. 3B, when the inverse write current $I_{W1}$ is allowed to flow through the lines 6, 7, the magnetic fields E6 and E7 are directed approximately in the same direction opposite to the direction in FIG. 3A, at the position of the magnetosensitive layer 2 in the magnetoresistive element 5, to enhance each other's intensity.

Figure 3C:
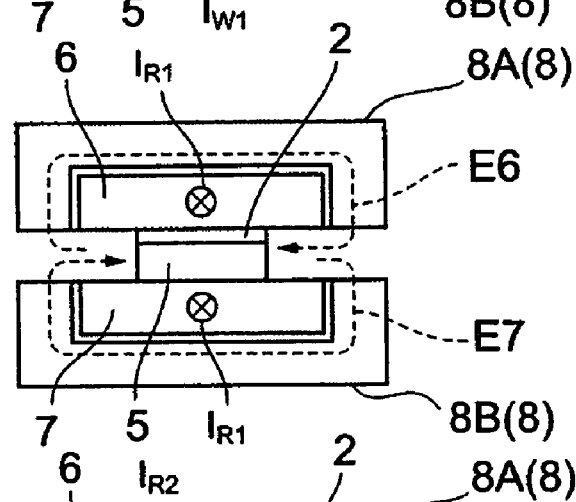
FIG. 3C is a sectional view on arrow along line III-III of a storage part including the magnetoresistive element 5 shown in FIG. 1.

As shown in FIG. 3C, when the read current $I_{R1}$ is allowed to flow through the lines 6, 7, the magnetic fields E6 and E7 are directed in the directions opposite to each other, at the position of the magnetosensitive layer 2 in the magnetoresistive element 5, to weaken each other's intensity.

Figure 3D:
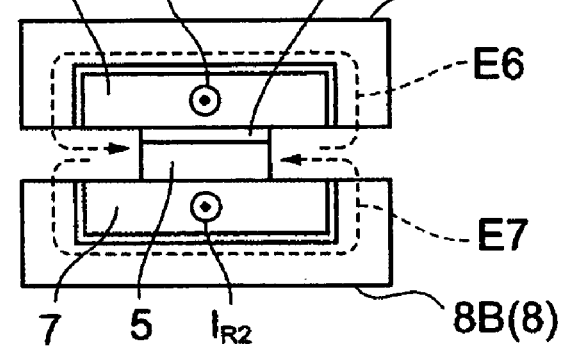
FIG. 3D is a sectional view on arrow along line III-III of a storage part including the magnetoresistive element 5 shown in FIG. 1.

As shown in FIG. 3D, when the read current $I_{R2}$ is allowed to flow through the lines 6, 7, the magnetic fields E6 and E7 are directed in the directions opposite to each other, which are reverse to the directions of the magnetic fields in the case of FIG. 3C, at the position of the magnetosensitive layer 2 in the magnetoresistive element 5, to weaken each other's intensity.

The magnetic fields E6, E7 shown in FIG. 1 will be supplementally described. The magnetic fields E6, E7 by the electric current flowing through the first line 6 and through the second line 7 are generated approximately in the same plane (YZ plane), but, precisely, they are displaced from each other along the longitudinal direction of the lines (X-axis). Namely, the cancellation of the magnetic fields in the magnetosensitive layer 2 is not complete.

In the present example, the storage part of each storage area P(X, Y) is provided with the magnetic yoke 8 surrounding the magnetoresistive element 5, and thus the magnetic fields E6, E7 generated by the electric current flowing through the respective lines 6, 7 are pulled into the magnetic yoke 8 whereby the magnetic fields E6, E7 are concentrated on the magnetoresistive element 5 including the magnetosensitive layer 2. Namely, the magnetic fields E6, E7 are close to each other in the magnetosensitive layer 2 in reading of information to effectively implement the cancellation thereof. In the case of the magnetic memory of the spin injection type using the aforementioned magnetic field assist, use of the magnetic yoke in writing of information brings the magnetic fields E6, E7 close to each other in the magnetosensitive layer 2 to enhance the intensity of the combined magnetic field, whereby the write current can be considerably reduced.

The threshold of the write current necessary for the spin injection magnetization reversal without the magnetic field assist was $5 \times 10^7$ A/cm$^2$, whereas with the simultaneous use of the magnetic field assist and the spin injection the threshold of the write current necessary for the spin injection magnetization reversal was $2.5 \times 10^7$ A/cm$^2$. When the magnetic yoke was further used, the threshold of the write current necessary for the spin injection magnetization reversal was $5 \times 10^6$ A/cm$^2$. Namely, the magnitude of the write current in the magnetic memory of the spin injection magnetization reversal type using the magnetic yoke and the magnetic field assist is reduced to one tenth of the write current without the magnetic field assist and to one fifth of the write current with the magnetic field assist but without the magnetic yoke.

There are a variety of structures for the magnetic yoke.

FIG. 4 is vertical sectional views of respective storage portions with different shapes of the magnetic yoke.

FIG. 4A shows a storage area in which the magnetic yoke 8 is composed of the upper magnetic yoke 8A only, FIG. 4B a storage area in which the magnetic yoke 8 is composed of the upper magnetic yoke 8A and lower magnetic yoke 8B, FIG. 4C a storage area in which the magnetic yoke 8 is composed of an upper magnetic yoke 8A' wrapped around the first line 6 to a bottom surface thereof, and FIG. 4D a storage area in which the magnetic yoke 8 is composed of an upper magnetic yoke 8A" extending to sides of the second line 7. The terms "upper" and "lower" follow the vertical locations in the drawing, and a configuration using only the lower magnetic yoke is the same as the configuration using only the upper magnetic yoke.

FIG. 5 is a drawing showing a vertical sectional configuration of an element main part including the magnetoresistive element 5.

This element main part is comprised of a TMR element consisting of a ferromagnetic layer 4a, an insulating layer 3, and a magnetosensitive layer 2 which are laid on an antiferromagnetic layer 4b, and a spin filter FL consisting of a nonmagnetic, electroconductive layer 41 and a fixed layer 40 which are laid on the TMR element. Directions of magnetizations of the fixed layers 4, 41 are parallel to the Y-axis.

The aforementioned first line 6 and second line 7 extend in the direction (X-axis) perpendicular to both of the direction of magnetization of the fixed layer 4 (Y-axis) and the thickness direction (Z-axis), at the position of the magnetoresistive element 5. Since the direction around the longitudinal direction (X-axis) of the first line 6 and the second line 7 coincides with the direction of magnetization of the fixed layer 4 at the position of the magnetosensitive layer 2, a change in the direction of magnetization can be effectively assisted when the electric current is allowed to flow through the first line 6 and through the second line 7 in writing of information.

The spin filter FL is provided with the nonmagnetic, electroconductive layer 41 disposed on the magnetosensitive layer 2, and the (second) fixed layer 40 in contact with the nonmagnetic, electroconductive layer 41, and the direction of the axis of easy magnetization of this second fixed layer 40 (Y-axis) is parallel to the direction of the axis of easy magnetization of the (first) fixed layer 4 (Y-axis). Therefore, when electrons are injected into the magnetosensitive layer 2, a spin-polarized current with spins being polarized in a specific direction is injected into the magnetosensitive layer 2 to reverse the magnetization by interaction with electrons in the magnetosensitive layer 2.

A material of the magnetosensitive layer 2 can be, for example, a ferromagnetic material such as Co, CoFe, NiFe, NiFeCo, CoPt, or CoFeB. A direction of magnetization of the magnetosensitive layer 2 can be changed by an electric current flowing perpendicularly to the film surface from the wiring layer, and the smaller the area of the magnetosensitive layer 2, the smaller the electric current (threshold of electric current) necessary for reversal of magnetization. The area of the magnetosensitive layer 2 is preferably not more than 0.01 μm$^2$. When the area of the magnetosensitive layer 2 exceeds 0.01 μm$^2$, the threshold current necessary for magnetization reversal increases to make recording of information difficult. The smaller the thickness of the magnetosensitive layer 2, the smaller the threshold of electric current for magnetization reversal. The thickness of the magnetosensitive layer 2 is preferably not more than 0.01 μm. When the thickness exceeds 0.01 μm, the electric current value necessary for magnetization reversal increases to make recording of information difficult A material of the nonmagnetic insulating layer 3 is an oxide or nitride of a metal such as Al, Zn, or Mg, and is preferably Al$_2$O$_3$ or MgO, for example. A structure for the fixed layers 4, 40 can be an exchange coupling type in which a ferromagnetic material layer is provided with an antiferromagnetic layer. A material of the antiferromagnetic layer can be a material selected from IrMn, PtMn, FeMn, NiMn, PtPdMn, RuMn, and NiO, or from arbitrary combinations among these. A material of the nonmagnetic layer 41 can be Cu or Ru. A material of the various wires can be Cu, AuCu, W, Al, or the like. A material of the nonmagnetic, electroconductive layer 41 can be, for example, Cu.

Figure 6:
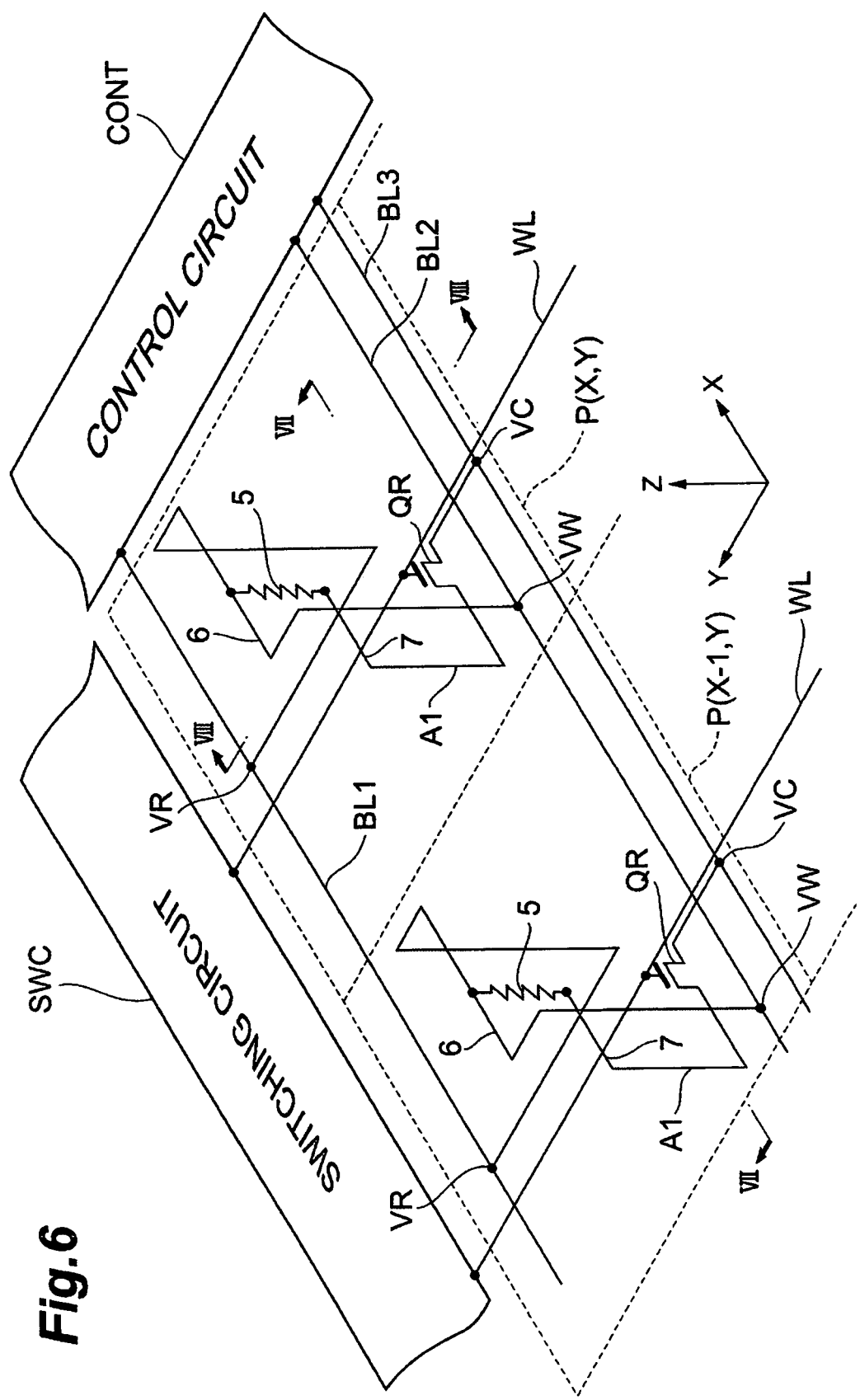
FIG. 6 is a circuit diagram of a magnetic memory with a plurality of storage areas P.

FIG. 6 is a circuit diagram of a magnetic memory provided with a plurality of storage areas P as described above.

This magnetic memory has word lines WL connected to gates for controlling conduction of respective switches QR, and potentials of the word lines WL are determined by a switching circuit SWC. Each reading terminal VR is connected to a first bit line BL1, each writing terminal VW to a second bit line BL2, and each terminal VC to a third bit line BL3, and potentials of these bit lines BL1, BL2, BL3 are controlled by a control circuit CONT.

When information (e.g., "1") is written into a storage area P(X, Y) at a specific address, the reading terminals VR of the storage areas in the associated Y-column are opened, the potential of the writing terminal VW is increased relative to the common terminal VC, and the switching circuit SWC controls the potential of the word line WL to turn the switches QR in the X-row on. This makes the direction of magnetization of the magnetosensitive layer in the magnetoresistive element 5, for example, "antiparallel" to the direction of magnetization of the fixed layer, to write "1."

For writing "0," the directions of these magnetizations are made, for example, "parallel." Namely, when information (e.g., "0") is written in a storage area P(X, Y) at a specific address, the reading terminals VR of the storage areas in the associated Y-column are opened, the potential of the writing terminal VW is lowered relative to the common terminal VC, and the switching circuit SWC controls the potential of the word line WL to turn the switches QR in the X-row on. This results in writing, for example, "0."

When information is read out of a storage area P(X, Y) at a specific address, the writing terminals VW of the storage areas in the associated Y-column are opened, the potential of the reading terminal VR is increased relative to the common terminal VC, and the switching circuit SWC controls the potential of the word line WL to turn the switches QR in the X-row on. This causes an electric current according to the information "1" or "0" written in the magnetoresistive element 5 located at the storage area P(X, Y), to flow between the reading terminal VR and the common terminal VC, and the stored information can be determined based thereon. The direction of the electric current in reading may be opposite to it, and may be arbitrarily set according to design.

The switching circuit SWC and control circuit CONT are formed in a semiconductor substrate.

Figure 7:
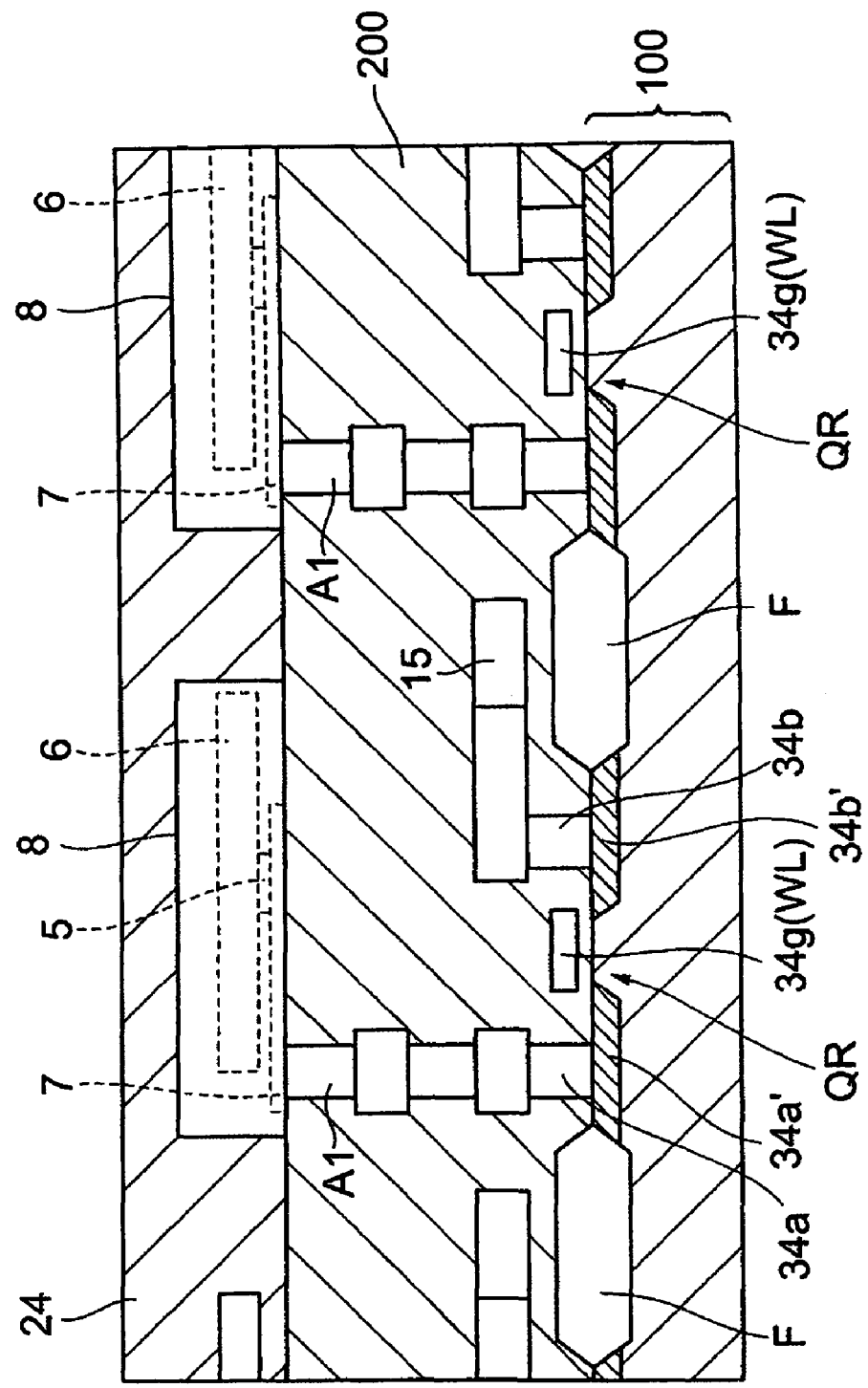
FIG. 7 is a vertical sectional view on arrow along line VII-VII of the magnetic memory shown in FIG. 6.

FIG. 7 is a vertical sectional view on arrow along line VII-VII of the magnetic memory shown in FIG. 6.

A lower electrode forming a read line 7 is connected through a vertical line A1, which penetrates an insulating layer 200 formed on a semiconductor substrate 100, in the thickness direction, to a source or drain electrode 34a of a read transistor QR It is assumed to be a drain electrode 34a herein. A gate electrode 34g of each read transistor QR constitutes a word line WL itself or is connected to a word line WL. Each read transistor QR is comprised of a drain electrode 34a, a source electrode 34b, a gate electrode 34g, and a drain region 34a' and a source region 34b' formed immediately below the drain electrode 34a and the source electrode 34b, respectively, and the drain electrode 34a and the source electrode 34b are connected to each other according to a potential of the gate electrode 34g. The source electrode 34b is connected through an internal connection line 15 to a bit line BL3.

Figure 8:
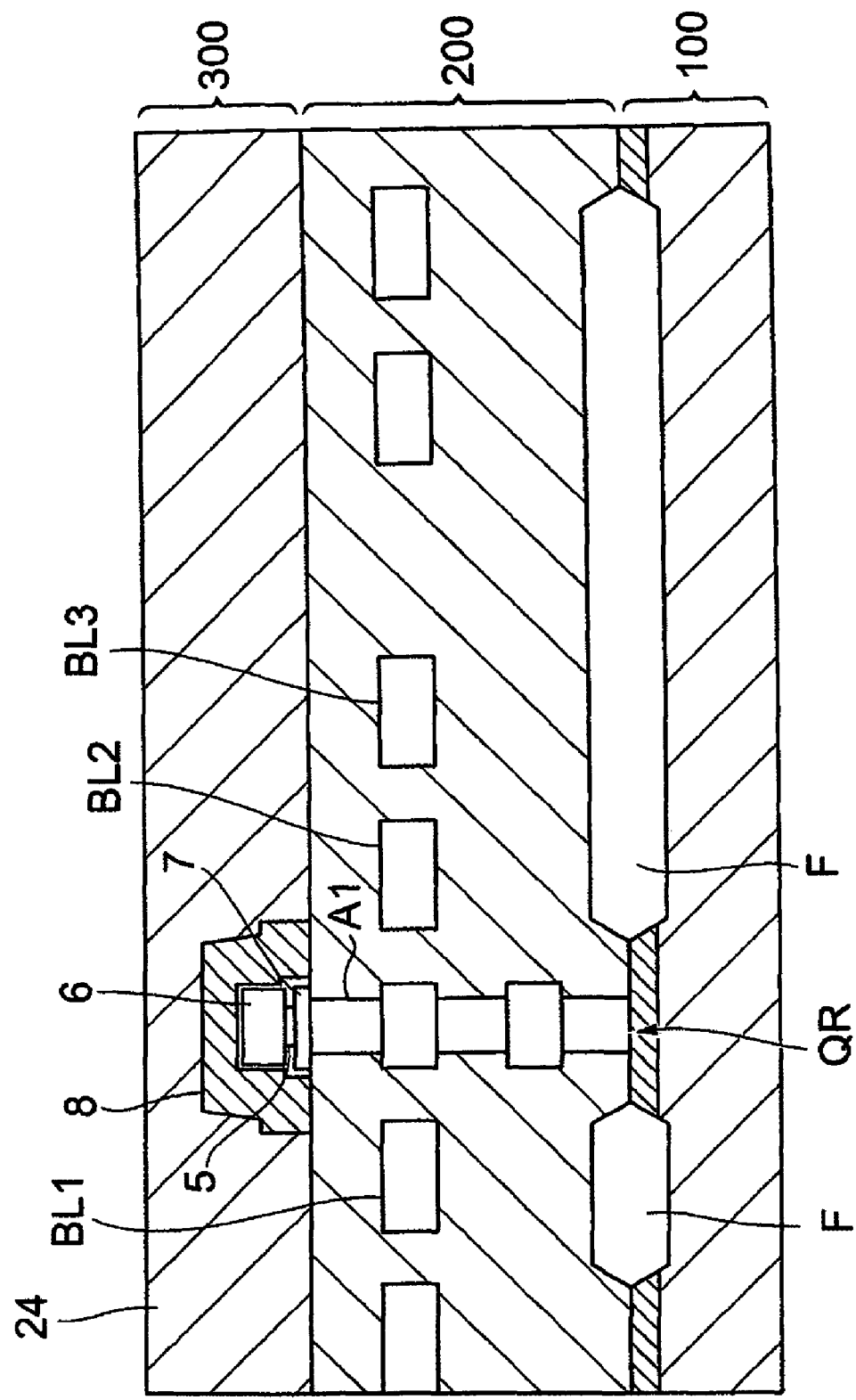
FIG. 8 is a vertical sectional view on arrow along line VIII-VIII of the magnetic memory shown in FIG. 6.

FIG. 8 is a vertical sectional view on arrow along line VIII-VIII of the magnetic memory shown in FIG. 6.

An oxide film (SiO$_2$) F by LOCOS (local oxidation of silicon) is formed around each read transistor QR.

The bit lines BL1, BL2, BL3 and the word lines WL are buried in the lower insulating layer 200 formed on the semiconductor substrate 100, and an upper insulating layer 24 is formed on the lower insulating layer 200. A plurality of lines are provided according to need in the lower insulating layer 200. The vertical lines A1 are wires penetrating the lower insulating layer 200 from the surface of the semiconductor substrate 100. The semiconductor substrate 100 is made, for example, of Si, and the source and drain regions are doped with an impurity of a conductivity type different from that of the semiconductor substrate 100. The lower insulating layer 200 is made of SiO$_2$ or the like.

The aforementioned magnetic yoke 8 may be of a hermetically closed type which covers the entire periphery beside the magnetoresistive element 5.

Figure 9:
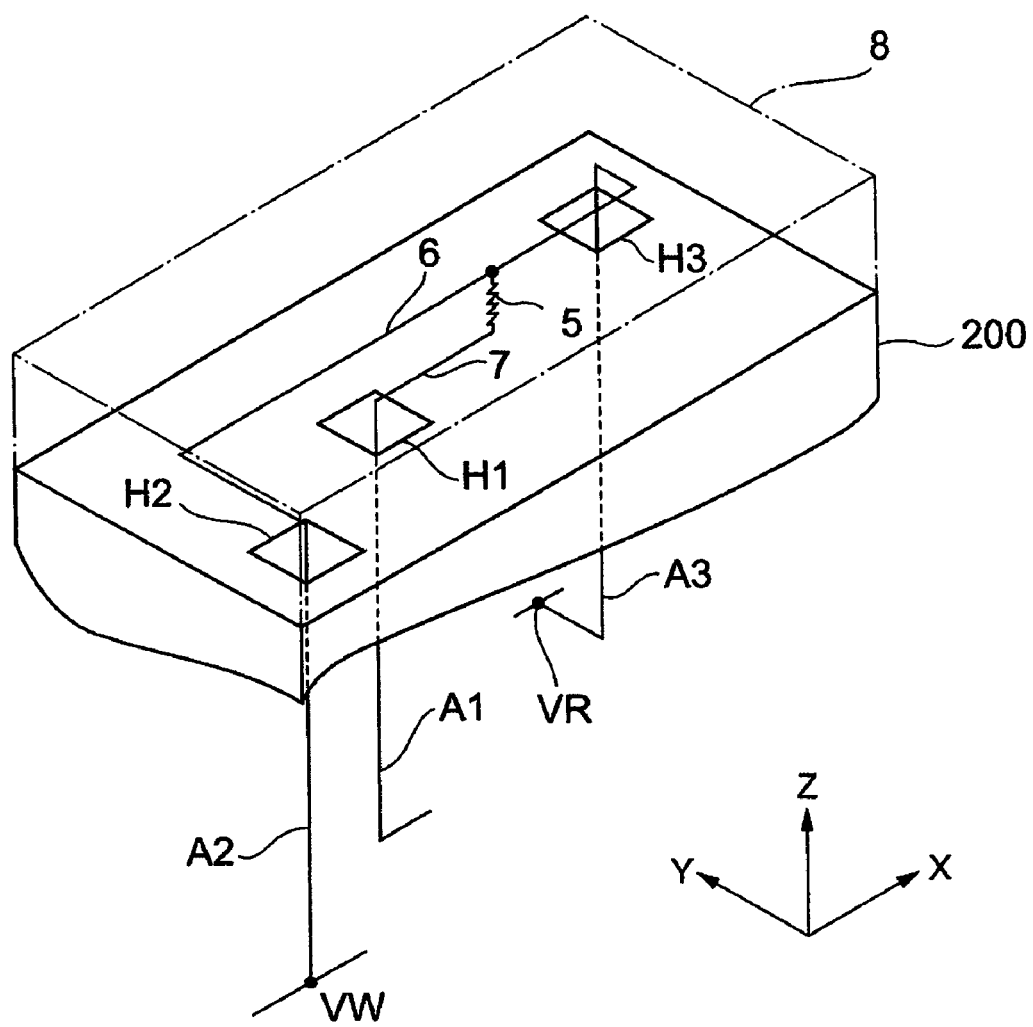
FIG. 9 is a perspective view of a storage part with a magnetic yoke 8 of a hermetically closed type.

FIG. 9 is a perspective view of a storage portion with the magnetic yoke 8 of the hermetically closed type.

After the second line 7, magnetoresistive element 5, and first line 6 are successively laid on the lower insulating layer 200, an insulating cover is formed so as to cover them, and the magnetic yoke 8 is formed thereon. The side walls of the magnetic yoke 8 are continuous throughout the entire periphery around the Z-axis of the. magnetoresistive element 5, and the top wall of the magnetic yoke 8 is provided on the top surfaces of the side walls to seal the magnetoresistive element 5.

Through holes H1, H2, and H3 reaching the semiconductor substrate 100 are provided in the lower insulating layer 200. One end of the second line 7 extending horizontally (within the XY plane) is connected to a vertical line A1, and the vertical line A1 is connected through the through hole H1 to an element (transistor QR) in the semiconductor substrate 100. One end of the first line 6 extending horizontally is connected to a vertical line A2, and the vertical line A2 is connected through the through hole H2 to an element (terminal VW) in the semiconductor substrate 100. The other end of the first line 6 extending horizontally is connected to a vertical line A3, and the vertical line A3 is connected through the through hole H3 to an element (terminal VR) in the semiconductor substrate 100.

With the use of the magnetic yoke 8 of the hermetically closed type described above, even if leaking magnetic flux or noise from the outside of the magnetoresistive element 5 propagates from any direction on the side, the magnetic yoke 8 will completely shield it to provide the effect of achieving excellent reliability.

As described above, the above-described magnetic memory can suppress increase of write current even in high-density arrangement of magnetoresistive elements, causes no influence on adjacent magnetoresistive elements, and utilizes the assist magnetic field and spin injection together, so as to achieve high access speed.

Figure 10:
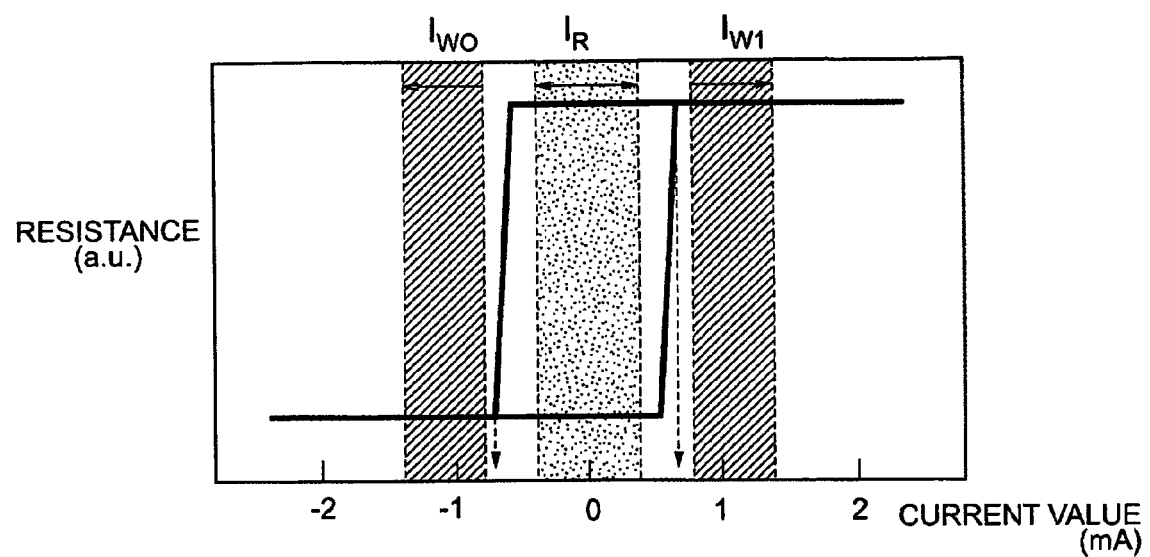
FIG. 10 is a graph showing the relationship of resistance of magnetoresistive element 5 with values of read current $I_R$ and write currents $I_{W0}$, $I_{W1}$ in the magnetic memory shown in FIG. 1.

FIG. 10 is a graph showing the relationship of the resistance of the magnetoresistive element S with values of read current $I_R$ and write currents $I_{W0}$, $I_{W1}$ in the magnetic memory shown in FIG. 1.

Absolute values of the write currents $I_{W1}$, $I_{W0}$ in recording of information are around 1 mA, and an absolute value of the read current $I_R$ in reading of information is around 0.4 mA. When the absolute value of the positive write current $I_{W1}$ exceeds 0.8 mA, magnetization reversal occurs in the magnetosensitive layer to record an antiparallel state "1." When the absolute value of the negative write current $I_{W0}$ exceeds 0.8 mA, magnetization reversal occurs in the magnetosensitive layer to record a parallel state "0."

Specifically, in a laminate of ferromagnetic layer (magnetization fixed layer)/nonmagnetic layer/ferromagnetic layer, as the electric current is increased in the positive direction of the laminate, the magnetization direction of the ferromagnetic layer is reversed at a predetermined threshold (critical current) and the magnetization directions of the magnetization fixed layer and the ferromagnetic layer become antiparallel (="1") to increase the resistance of the magnetoresistive element. After that, as the current value is decreased in the negative direction, the magnetization of the ferromagnetic layer is reversed at a predetermined negative threshold (critical current), and the magnetization directions of the magnetization fixed layer and the ferromagnetic layer become parallel (="0") to reduce the resistance of the magnetoresistive element 5. Electric current values capable of recording such information are set to below 1.5 mA in consideration of power consumption and influence of noise to the outside as well.

In the recording element subject to the spin injection magnetization reversal, the magnetization direction of the ferromagnet is kept unchanged as long as the electric current does not exceed the critical current value. Therefore, when the electric current for reading is kept below the critical current value, nondestructive reading can be implemented without rewriting recorded information.

In the case of the spin injection recording to record data by magnetization reversal of the magnetosensitive layer by the electric current flowing perpendicularly to the film surface, the electric current for reversal is as large as $1 \times 10^8$ to $1 \times 10^6$ $A/cm^2$ and the resistance of the TMR element is relatively high. Therefore, when the write current is allowed to flow, the TMR element part tends to generate a considerable amount of heat. However, since the aforementioned magnetic memory is provided with the magnetic yoke 8 around the lines, the current magnetic fields generated by the electric current flowing through the lines are efficiently applied to the magnetosensitive layer and the spin injection magnetization reversal is effected by lower electric current Furthermore, the magnetic yoke 8 alleviates influence of an external magnetic field on the magnetosensitive layer in which data is recorded, whereby improvement can be made in resistance of the memory device to the external magnetic field.

Next, a method of producing the aforementioned magnetic memory will be described. The method will be described as to the magnetic memory of the structure of (FIG. 4A).

Figure 11A:
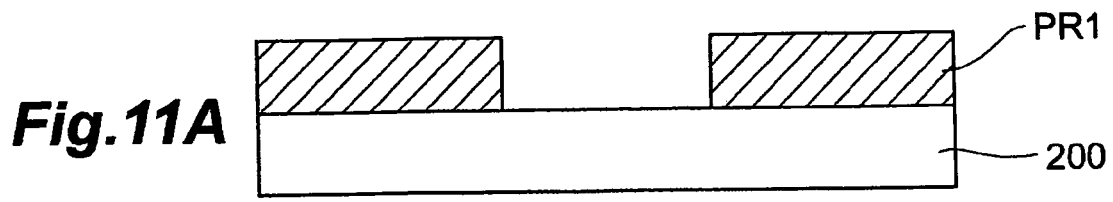
FIG. 11A is a drawing for explaining a production method of a magnetic memory.
Figure 11B:
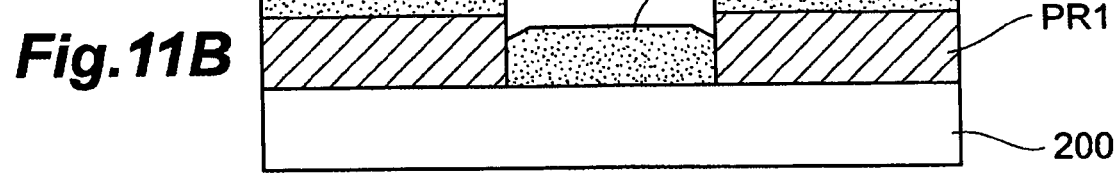
FIG. 11B is a drawing for explaining a production method of a magnetic memory.
Figure 11C:
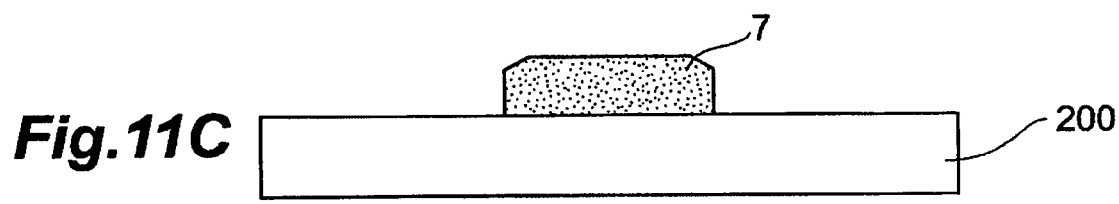
FIG. 11C is a drawing for explaining a production method of a magnetic memory.
Figure 11D:
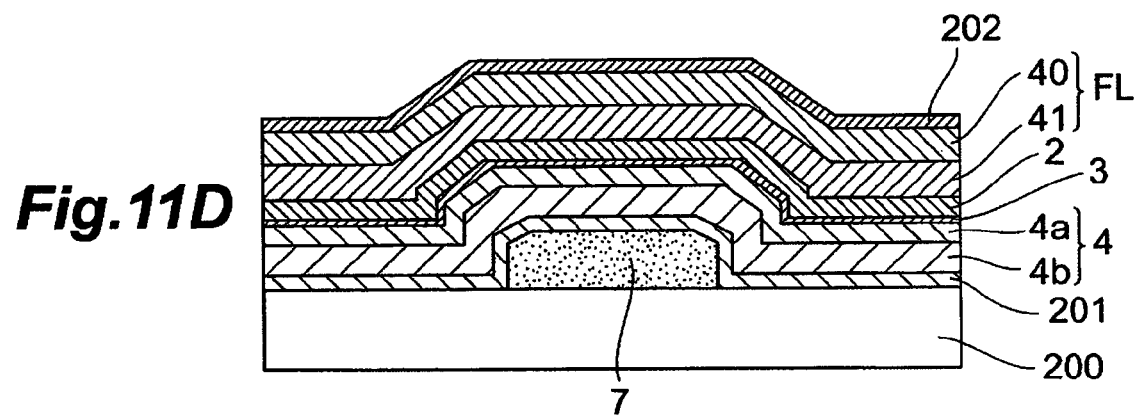
FIG. 11D is a drawing for explaining a production method of a magnetic memory.
Figure 11E:
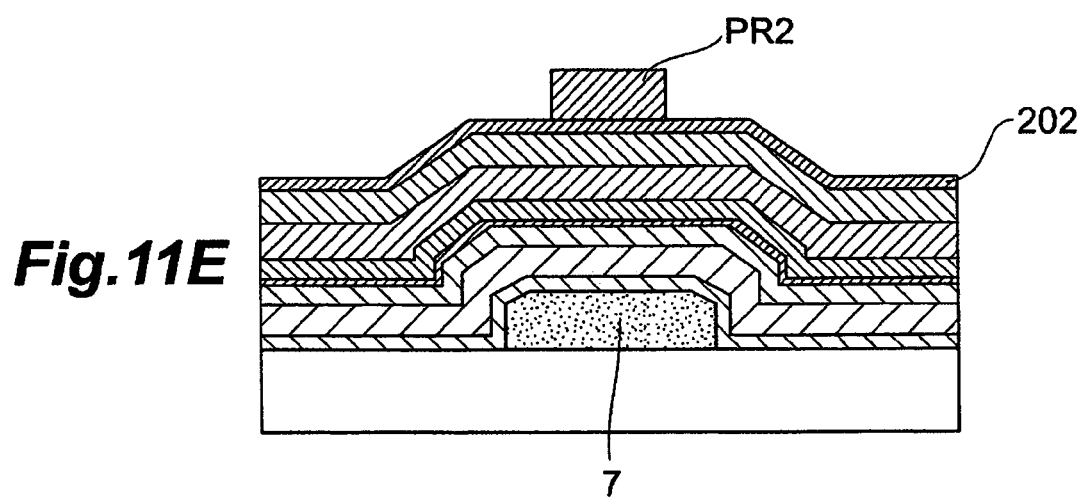
FIG. 11E is a drawing for explaining a production method of a magnetic memory.

First, as shown in FIG. 11A, a photoresist PR1 is patterned to open in the central region on a lower insulating layer 200. Next, as shown in FIG. 11B, an electrode layer 7 is deposited on the photoresist PR1 by sputtering or the like. Furthermore, as shown in FIG. 11C, the electrode material on the photoresist PR1 is removed by lift-off. Thereafter, as shown in FIG. 11D, the following layers are sequentially deposited on the lower insulating layer 200: base layer 201 of tantalum, antiferromagnetic layer 4b of IrMn, ferromagnetic layer 4a of CoFe, insulating layer 3 of $Al_2O_3$, magnetosensitive layer 2 of CoFe, nonmagnetic, electroconductive layer 41 of Ru, ferromagnetic layer 40 of CoFe, and cap layer 202 of tantalum. The insulating layer 3 can also be formed by depositing A1 and then oxidizing it The deposition can be effected by sputtering. Next, as shown in FIG. 11E, a photoresist PR2 is patterned on the central part of the cap layer 202. Namely, the photoresist PR2 is located above the lower line 7.

Figure 11F:
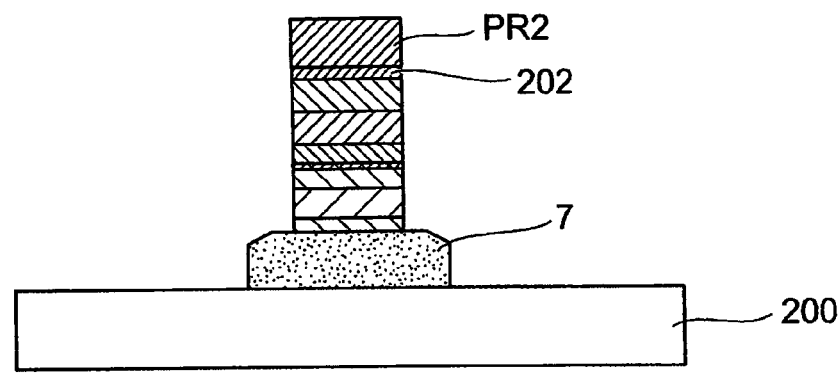
FIG. 11F is a drawing for explaining a production method of a magnetic memory.
Figure 11G:
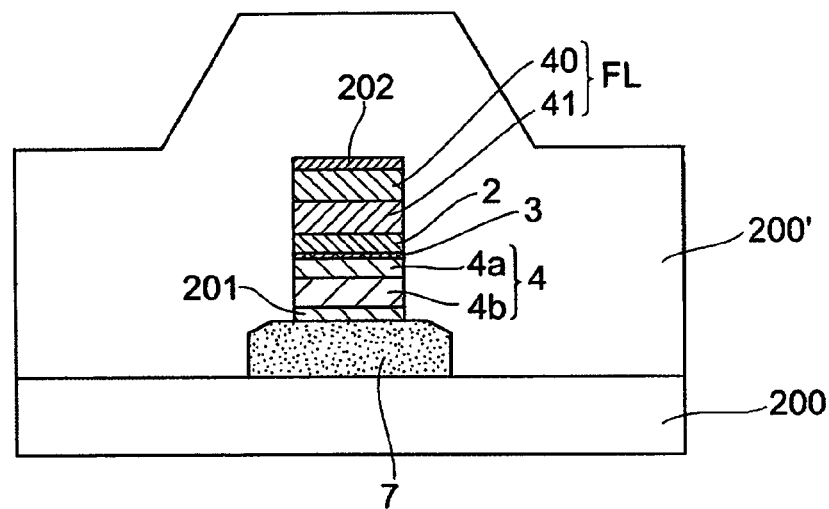
FIG. 11G is a drawing for explaining a production method of a magnetic memory.
Figure 11H:
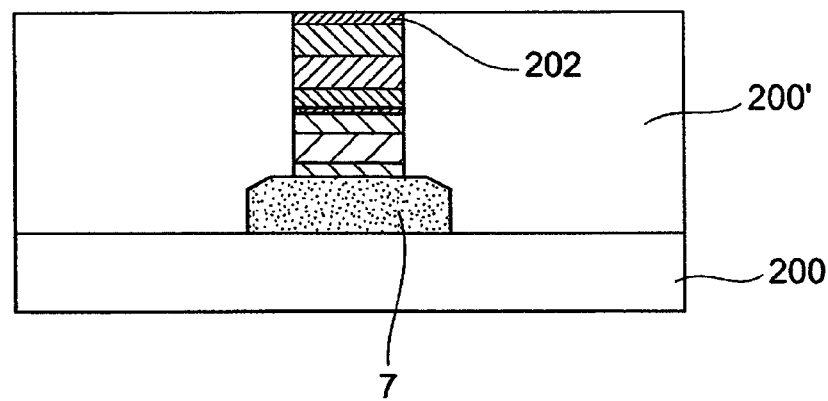
FIG. 11H is a drawing for explaining a production method of a magnetic memory.

Thereafter, as shown in FIG. 11F, the laminate is dry etched using the photoresist PR2 as a mask This etching is performed before the surface of the lower line 7 is exposed. Next, as shown in FIG. 11G, the photoresist PR2 is removed, and thereafter an intermediate insulating layer 200' of $SiO_2$ is deposited on the lower insulating layer 200 by sputtering, CVD, or the like until the cap layer 202 is buried in the intermediate insulating layer 200'. Then, as shown in FIG. 11H, the intermediate insulating layer 200' is polished by means of a CMP (Chemical Mechanical Polish) machine to expose the surface of the cap layer 202 and smooth the surface of the intermediate insulating layer 200'.

Figure 11I:
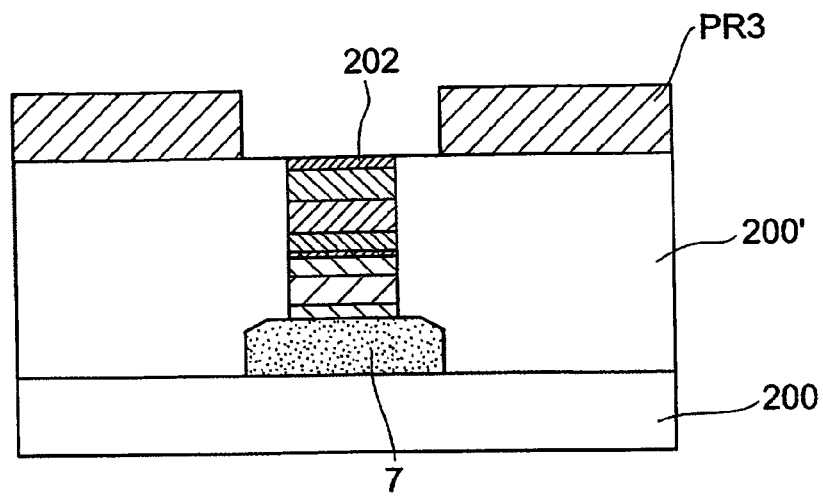
FIG. 11I is a drawing for explaining a production method of a magnetic memory.
Figure 11J:
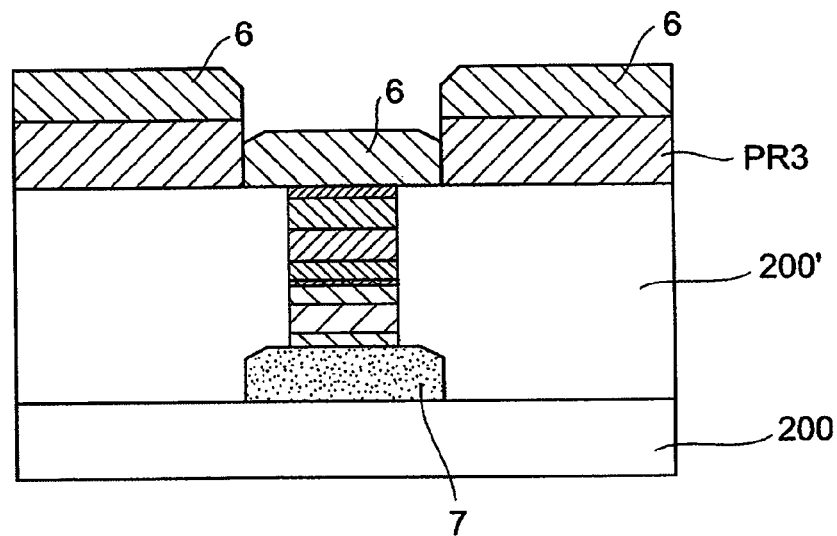
FIG. 11J is a drawing for explaining a production method of a magnetic memory.
Figure 11K:
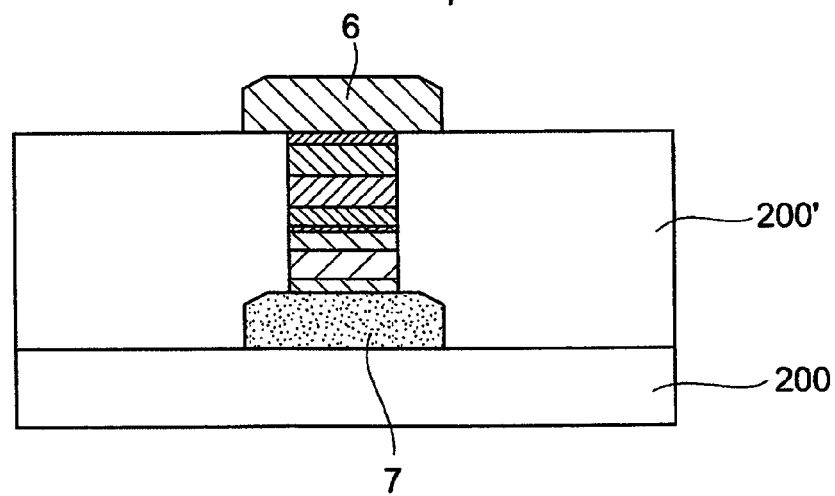
FIG. 11K is a drawing for explaining a production method of a magnetic memory.

Next, as shown in FIG. 11I, a photoresist PR3 is patterned to open in the central region on the surface of the intermediate insulating layer 200'. Thereafter, a wiring material 6 is deposited on the photoresist PR3 by sputtering or the like (FIG. 11J), and then the photoresist PR3 is lifted off to form the upper line 6 on the cap layer 202 (FIG. 11K). The wiring structure can be a single-layer structure consisting of a material selected from Ti, Cu, and Ta, or a multilayer structure consisting of multiple types of materials.

Figure 11L:
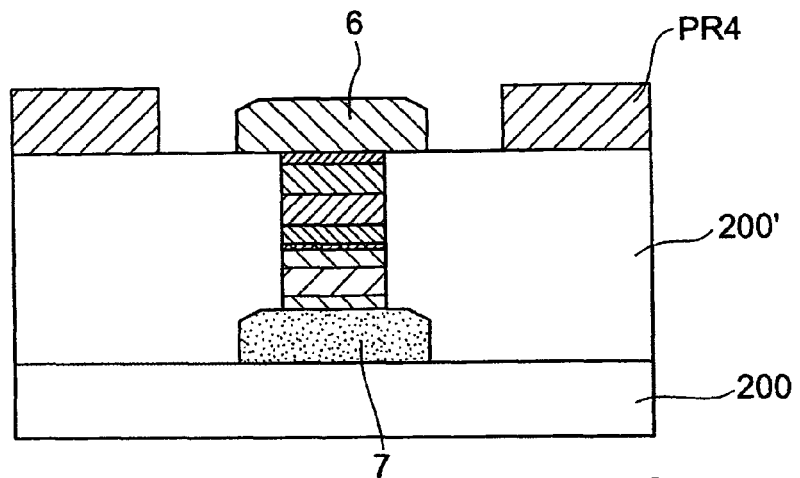
FIG. 11L is a drawing for explaining a production method of a magnetic memory.
Figure 11M:
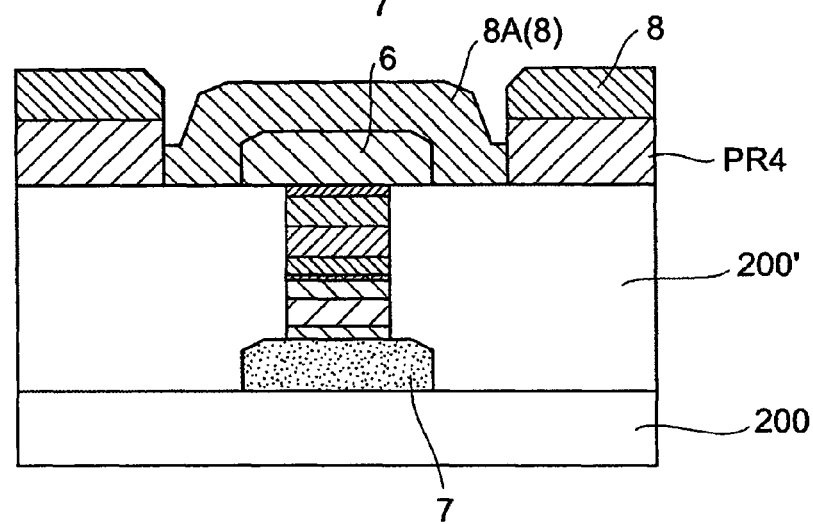
FIG. 11M is a drawing for explaining a production method of a magnetic memory.
Figure 11N:
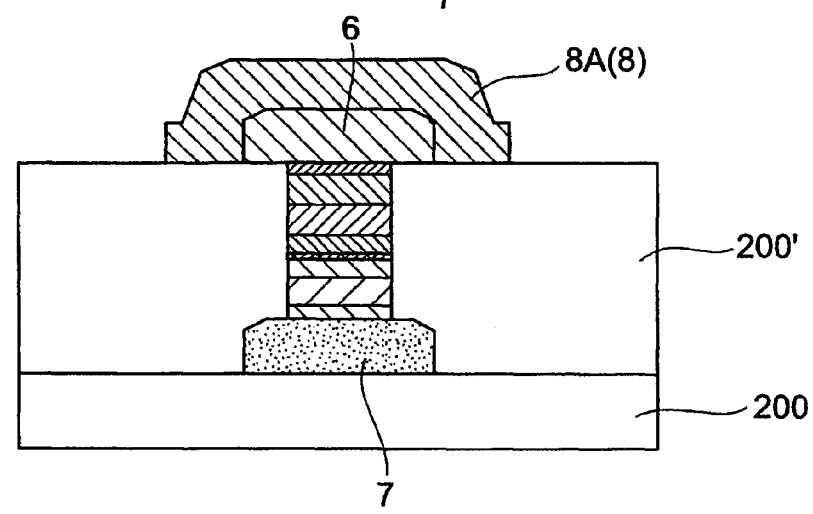
FIG. 11N is a drawing for explaining a production method of a magnetic memory.
Figure 11O:
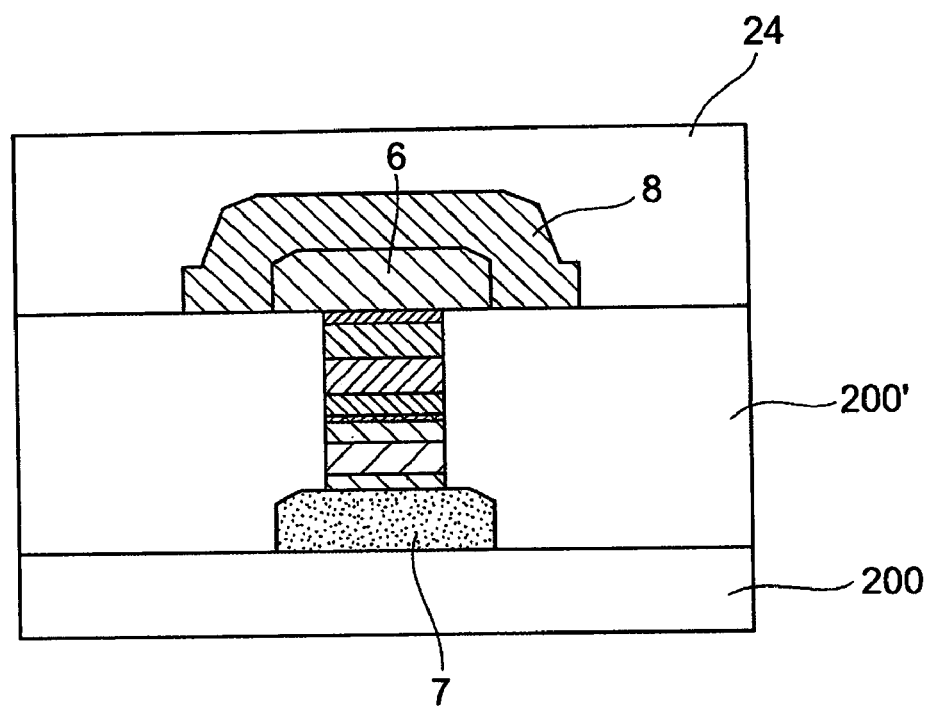
FIG. 11O is a drawing for explaining a production method of a magnetic memory.

Furthermore, a photoresist PR4 is patterned to open in a region including the formed region of the upper line 6 on the intermediate insulating layer 200' (FIG. 11L). Then a magnetic material 8 of NeFe or the like is deposited on the photoresist PR4 by sputtering or the like (FIG. 14M). Then the excess magnetic material is removed together with the photoresist PR4 by lift-off to form the upper magnetic yoke 8A (8) (FIG. 14N). Finally, as shown in FIG. 11O, an upper insulating layer 24 of $SiO_2$ is deposited over the magnetic yoke 8 by means of a CVD apparatus.

A method of producing a magnetic memory with the upper and lower magnetic yokes will be described below. The magnetic memory described herein is one of the structure of (FIG. 4B).

Figure 12A:
FIG. 12A is a drawing for explaining a production method of a magnetic memory.
Figure 12B:
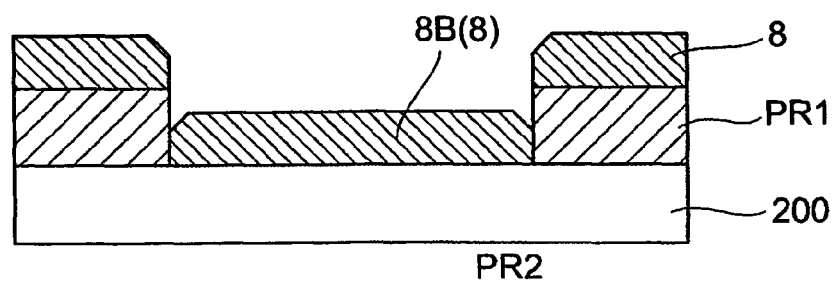
FIG. 12B is a drawing for explaining a production method of a magnetic memory.
Figure 12C:
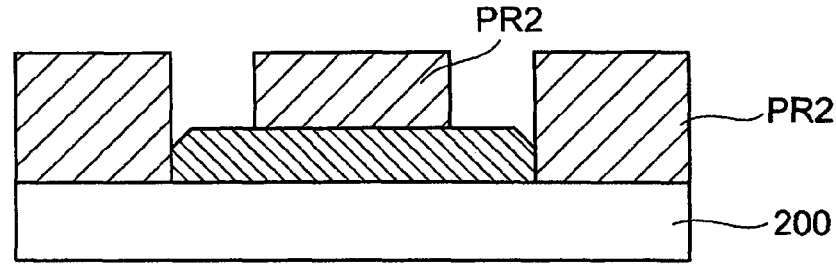
FIG. 12C is a drawing for explaining a production method of a magnetic memory.

First, as shown in FIG. 12A, a photoresist PR1 is patterned to open largely in the central region on the lower insulating layer 200. Next, as shown in FIG. 12B, a magnetic material 8B (8) of NiFe or the like is deposited on the photoresist PR1 by sputtering or the like. This photoresist PR1 is lifted off to leave the magnetic material in the center, and a photoresist PR2 is further patterned on the substrate to open in the peripheral region of the magnetic material 8B (FIG. 12C).

Figure 12D:
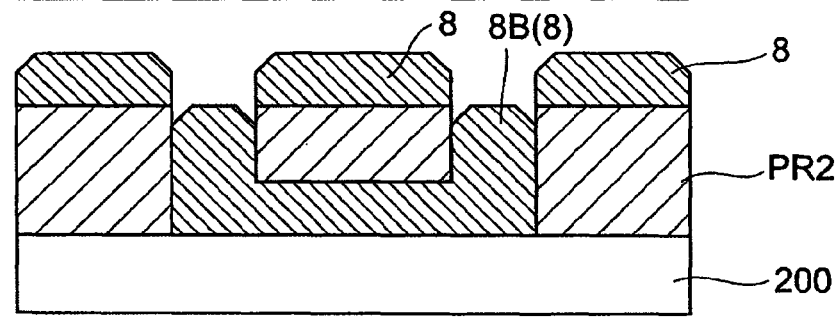
FIG. 12D is a drawing for explaining a production method of a magnetic memory.
Figure 12E:
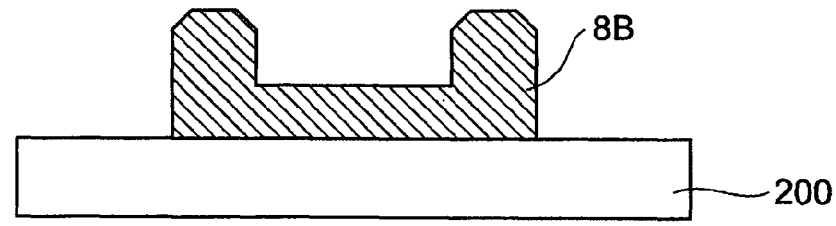
FIG. 12E is a drawing for explaining a production method of a magnetic memory.
Figure 12F:
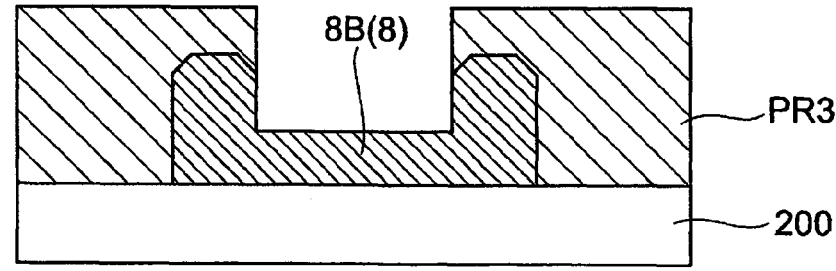
FIG. 12F is a drawing for explaining a production method of a magnetic memory.

Next, as shown in FIG. 12D, a magnetic material of NiFe or the like is further deposited on the photoresist PR1 by sputtering or the like, and then lift-off is effected (FIG. 12E). This completes the lower magnetic yoke 8B of a U-shaped cross section. Subsequently, a photoresist PR3 is patterned to open and expose the interior of the recess of the lower magnetic yoke 8B (FIG. 12F).

Figure 12G:
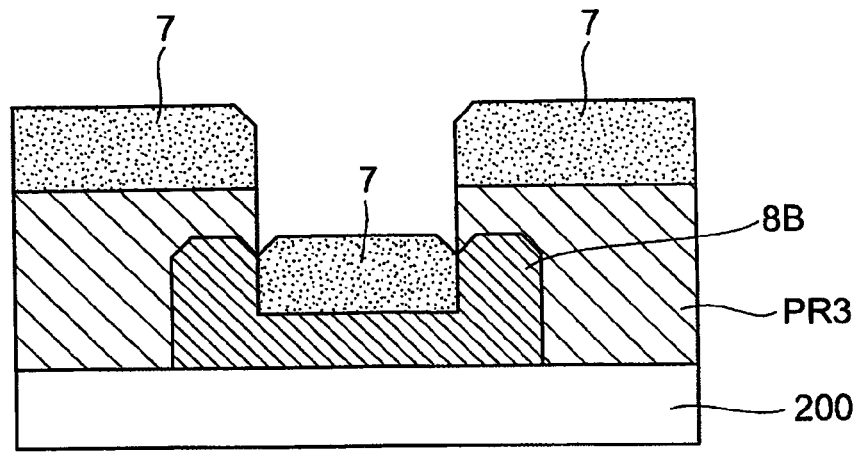
FIG. 12G is a drawing for explaining a production method of a magnetic memory.
Figure 12H:
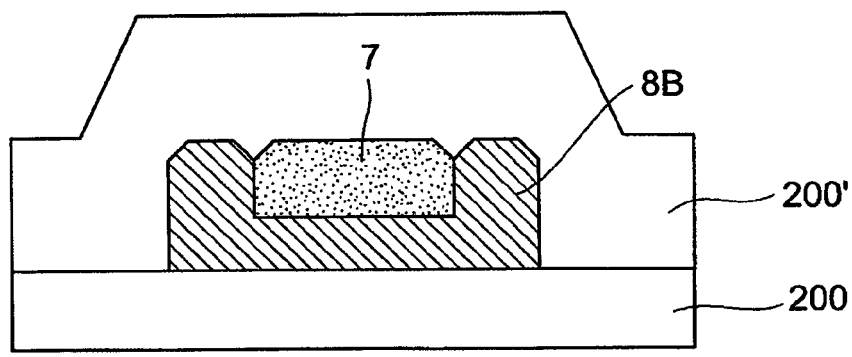
FIG. 12H is a drawing for explaining a production method of a magnetic memory.
Figure 12I:
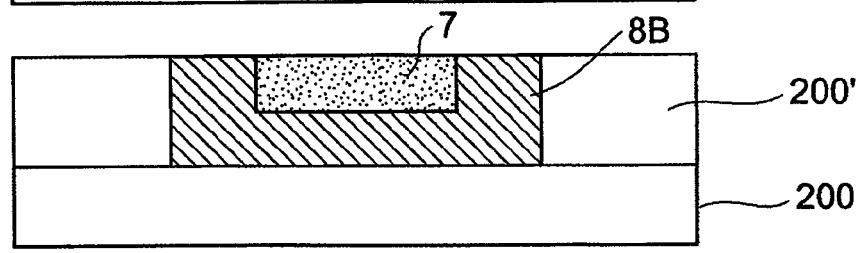
FIG. 12I is a drawing for explaining a production method of a magnetic memory.

Next, as shown in FIG. 12G, an electrode layer 7 is deposited on the photoresist PR3 by sputtering or the like. Furthermore, as shown in FIG. 12B, the electrode material on the photoresist PR3 is removed by lift-off. Thereafter, as shown in FIG. 12H, a first intermediate insulating layer 200' of $SiO_2$ is deposited on the lower insulating layer 200 by CVD or sputtering. A raw material for $SiO_2$ in the CVD is, for example, $Si(OC_2H_5)_4$. Next, as shown in FIG. 12I, the first intermediate insulating layer 200' is polished by means of a CMP (Chemical Mechanical Polish) machine to smooth the surface of the first intermediate insulating layer 200'.

Figure 12J:
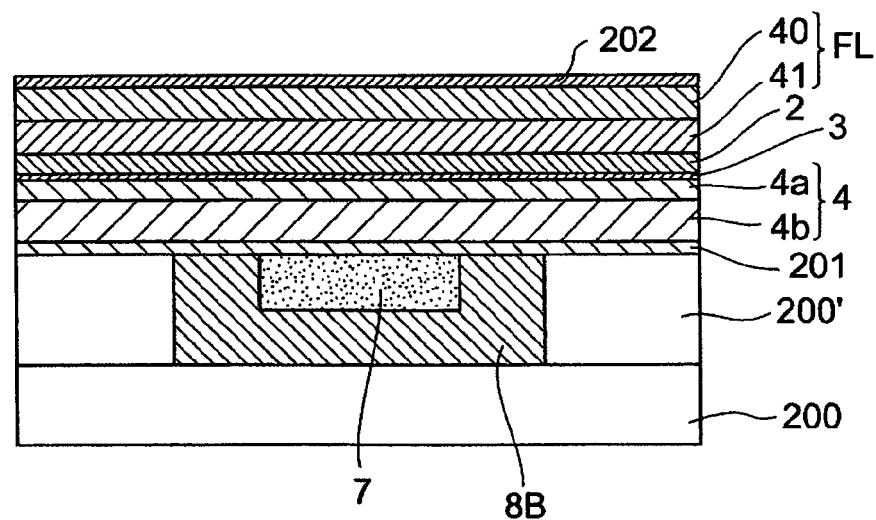
FIG. 12J is a drawing for explaining a production method of a magnetic memory.

Next, as shown in FIG. 12J, the following layers are sequentially deposited on the surface of the first intermediate insulating layer 200': base layer 201 of tantalum, antiferromagnetic layer 4b of IrMn, ferromagnetic layer 4a of CoFe, insulating layer 3 of $Al_2O_3$, magnetosensitive layer 2 of CoFe, nonmagnetic, electroconductive layer 41 of Ru, ferromagnetic layer 40 of CoFe, and cap layer 202 of tantalum. The insulating layer 3 can also be formed by depositing Al and then oxidizing it. The deposition can be effected by sputtering.

Figure 12K:
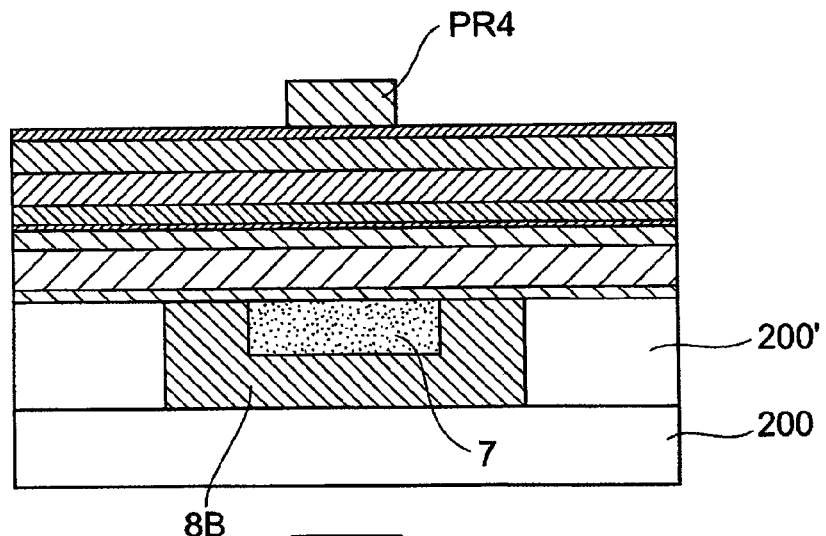
FIG. 12K is a drawing for explaining a production method of a magnetic memory.

Next, as shown in FIG. 12K, a photoresist PR4 is patterned on the central part of the cap layer 202. Namely, the photoresist PR4 is located above the lower line 7.

Figure 12L:
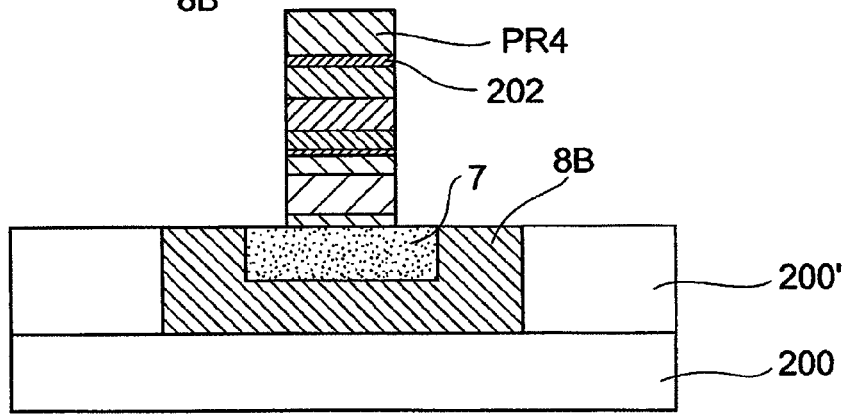
FIG. 12L is a drawing for explaining a production method of a magnetic memory.
Figure 12M:
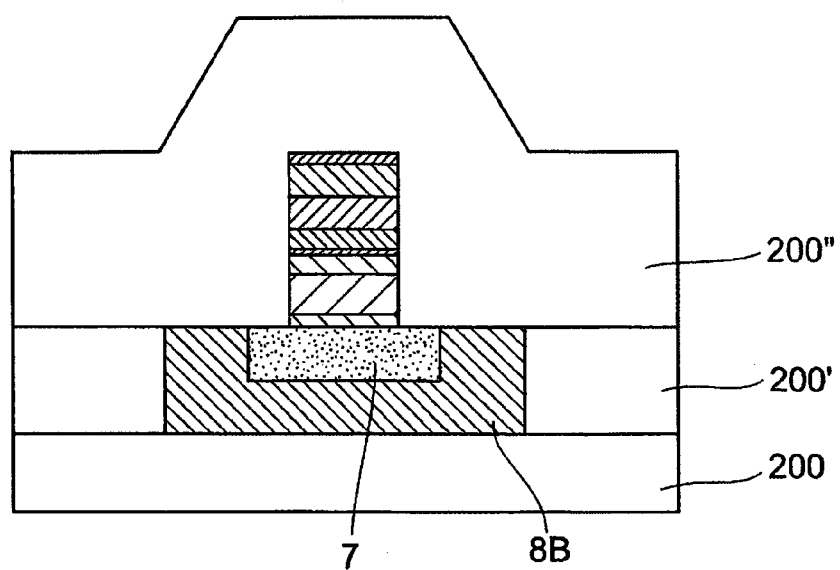
FIG. 12M is a drawing for explaining a production method of a magnetic memory.
Figure 12N:
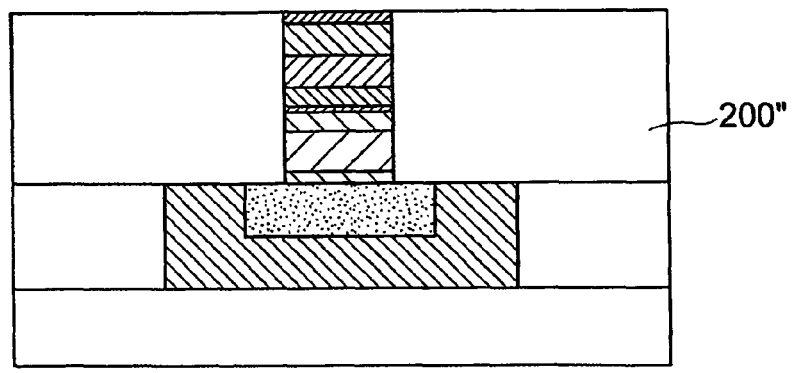
FIG. 12N is a drawing for explaining a production method of a magnetic memory.

Thereafter, as shown in FIG. 12L, the laminate is dry etched using the photoresist PR4 as a mask. This etching is performed before the surface of the lower line 7 is exposed. Next, as shown in FIG. 12M, the photoresist PR4 is removed and thereafter a second intermediate insulating layer 200" of $SiO_2$ is deposited on the first intermediate insulating layer 200' by sputtering, CVD, or the like until the cap layer 202 is buried in the second intermediate insulating layer 200". Then, as shown in FIG. 12N, the second intermediate insulating layer 200" is polished by means of the CMP machine to expose the surface of the cap layer 202 and smooth the surface of the second intermediate insulating layer 200".

Figure 12O:
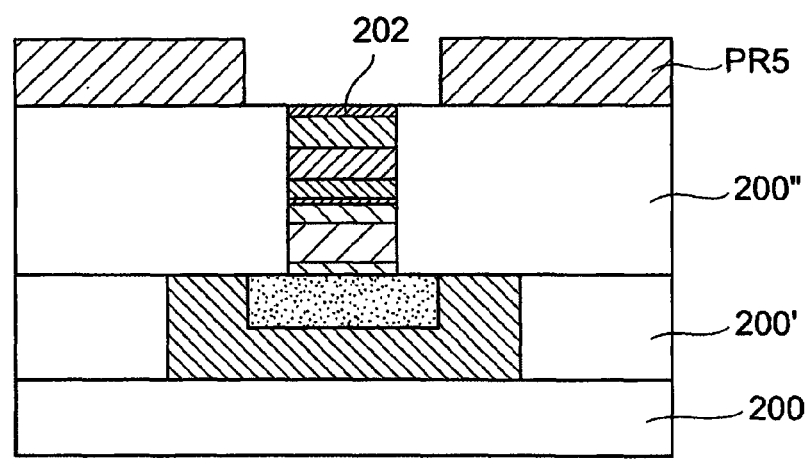
FIG. 12O is a drawing for explaining a production method of a magnetic memory.
Figure 12P:
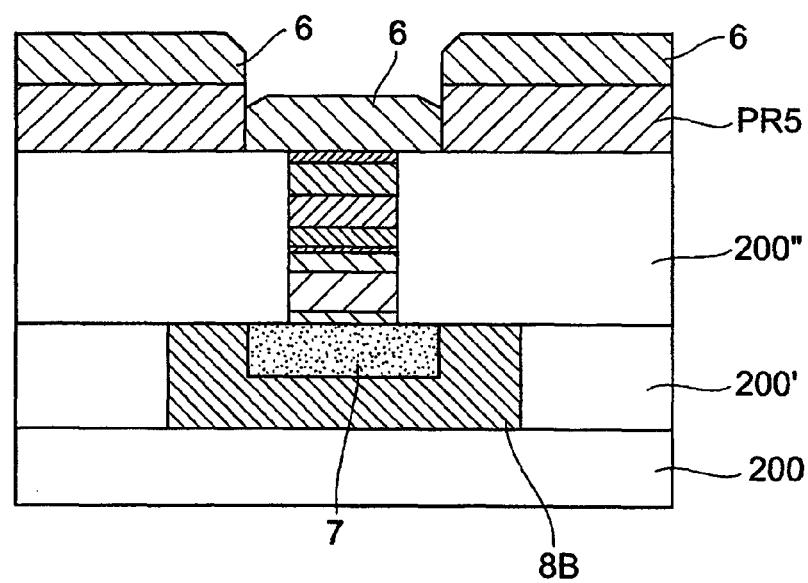
FIG. 12P is a drawing for explaining a production method of a magnetic memory.
Figure 12Q:
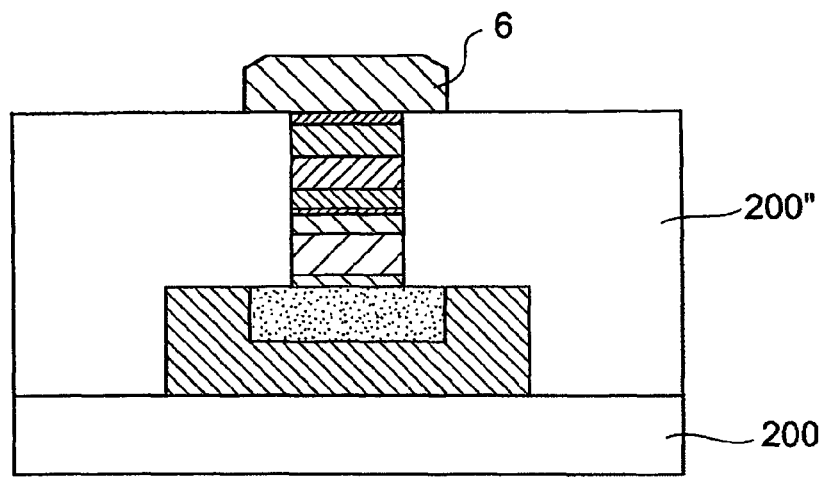
FIG. 12Q is a drawing for explaining a production method of a magnetic memory.

Next, as shown in FIG. 12O, a photoresist PR5 is patterned to open in the central region on the surface of the second intermediate. insulating layer 200". Thereafter, a wiring material 6 is deposited on the photoresist PR5 by sputtering or the like (FIG. 12P), and the photoresist PR5 is lifted off to form the upper line 6 on the cap layer 202 (FIG. 12Q). The wiring structure can be a single-layer structure consisting of a material such as Ti, Cu, or Ta, or a multilayer structure consisting of multiple types of materials.

Figure 12R:
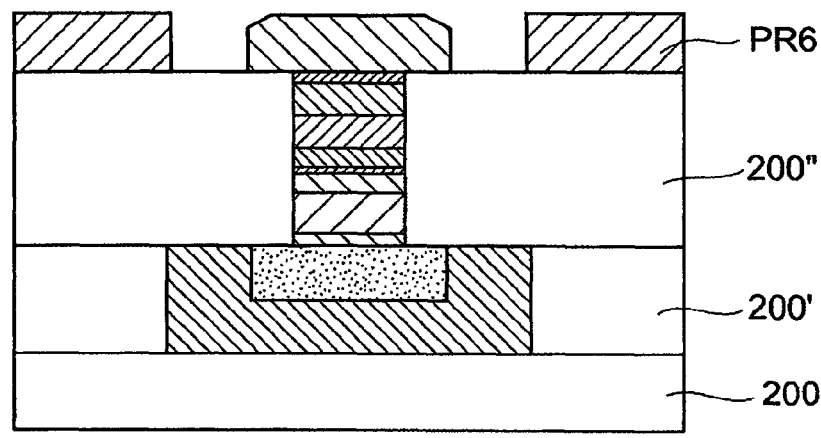
FIG. 12R is a drawing for explaining a production method of a magnetic memory.
Figure 12S:
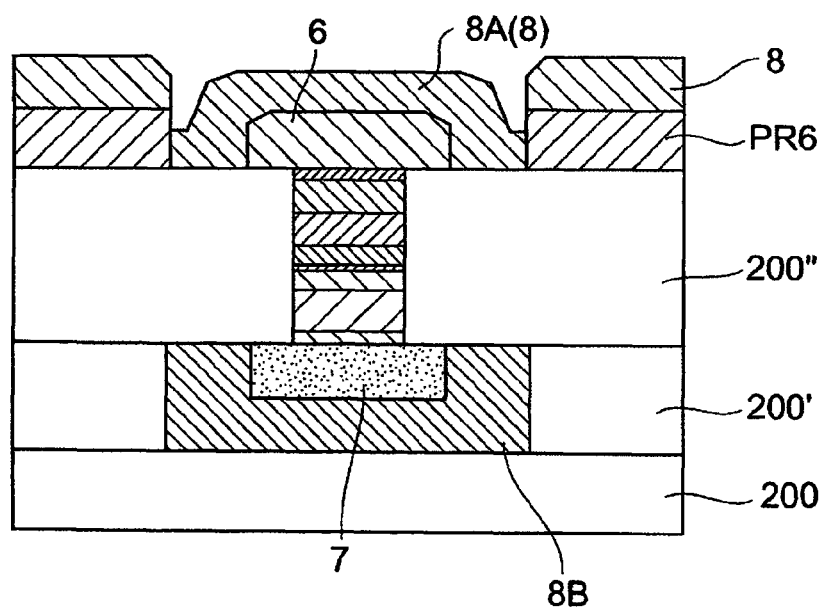
FIG. 12S is a drawing for explaining a production method of a magnetic memory.
Figure 12T:
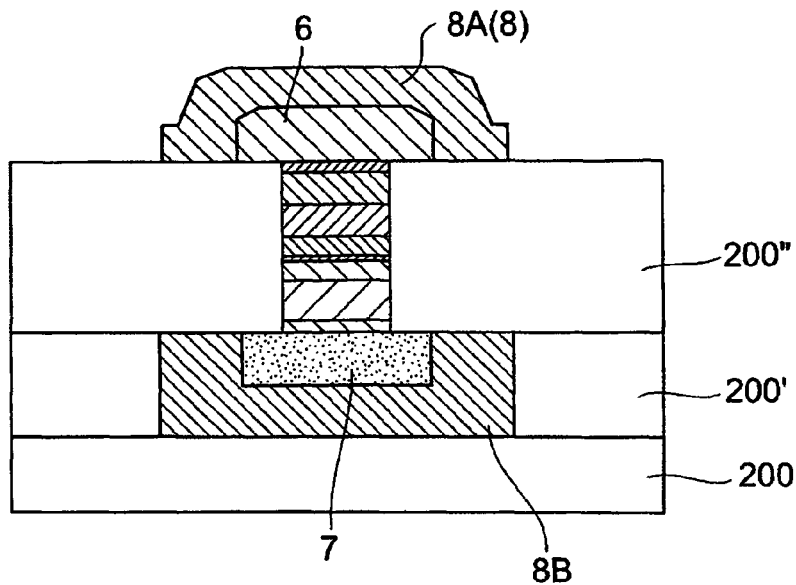
FIG. 12T is a drawing for explaining a production method of a magnetic memory.
Figure 12U:
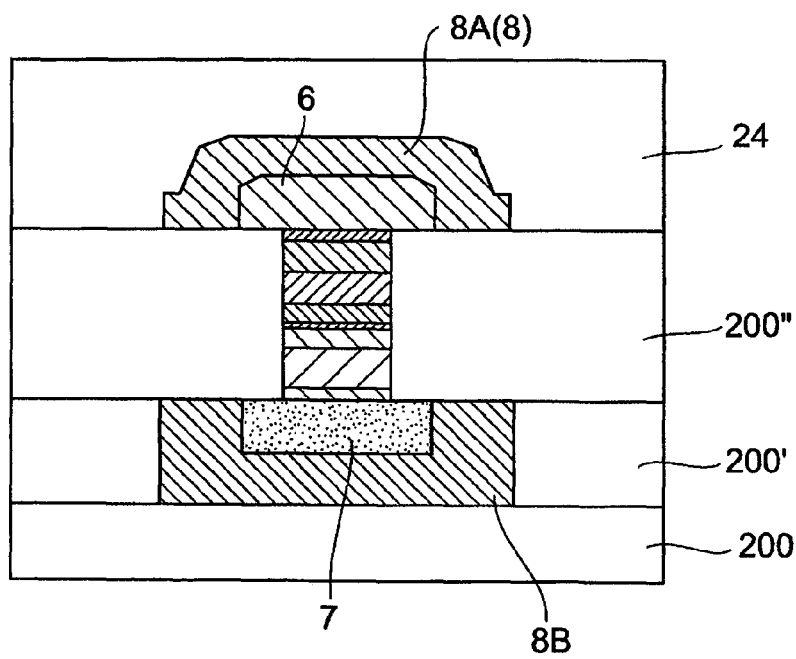
FIG. 12U is a drawing for explaining a production method of a magnetic memory.

Furthermore, a photoresist PR6 is patterned to open in a region including the formed region of the upper line 6 on the second intermediate insulating layer 200" (FIG. 12R). Next, a magnetic material 8 of NeFe or the like is deposited on the photoresist PR6 by sputtering or the like (FIG. 12S). Next, the excess magnetic material is removed together with the photoresist PR6 by lift-off to form the upper magnetic yoke 8A (8) (FIG. 12T). Finally, as shown in FIG. 12U, the upper insulating layer 24 of $SiO_2$ is deposited on the magnetic yoke 8 by means of a CVD apparatus.

A method of producing a magnetic memory with the magnetic yoke of the hermetically closed type will also be described below. The magnetic memory described herein is one of the structure of FIG. 9.

The lower line 7 is connected through the through hole in the lower insulating layer 200 to the element in the semiconductor substrate and the steps of FIG. 11A to FIG. 11K are carried out.

Figure 13A:
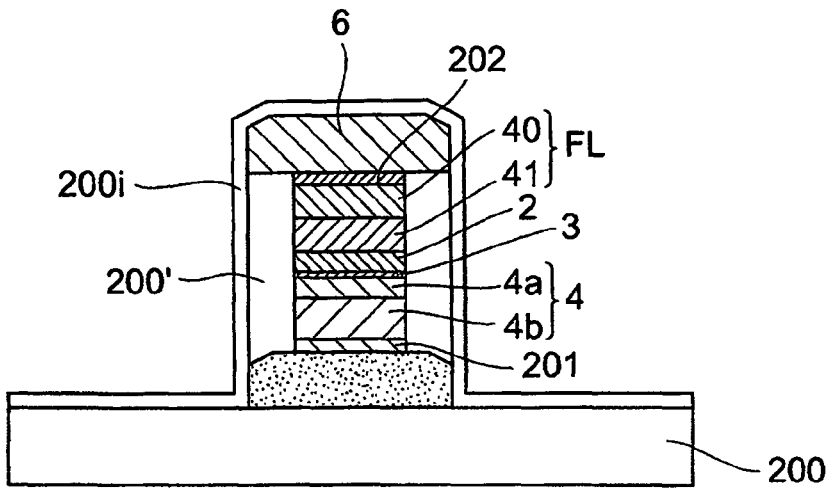
FIG. 13A is a drawing for explaining a production method of a magnetic memory.
Figure 13B:
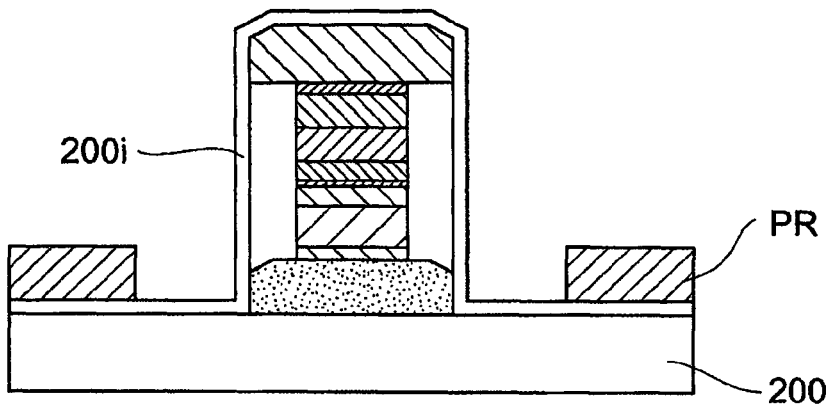
FIG. 13B is a drawing for explaining a production method of a magnetic memory.
Figure 13C:
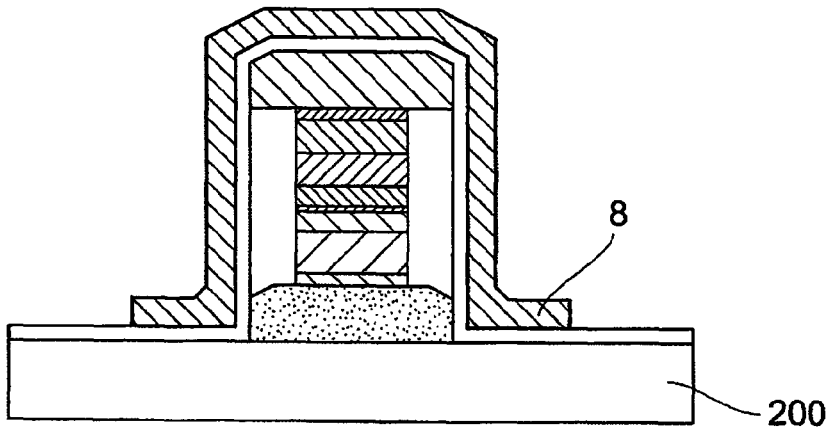
FIG. 13C is a drawing for explaining a production method of a magnetic memory.

Thereafter, as shown in FIG. 13A, the insulating layer 200' in the periphery is dry etched using the upper line 6 as a mask to expose the surface of the lower insulating layer 200, and the exposed element and the substrate surface are covered by a protective insulating film 200i (FIG. 13A). Thereafter, a photoresist PR is patterned to open in a region including the element formed region on the lower insulating layer 200. (FIG. 13B), then a magnetic material of NiFe or the like is deposited thereon, and lift-off is performed to complete the magnetic yoke 8 of the hermetically closed type (FIG. 13C).

Figure 14:
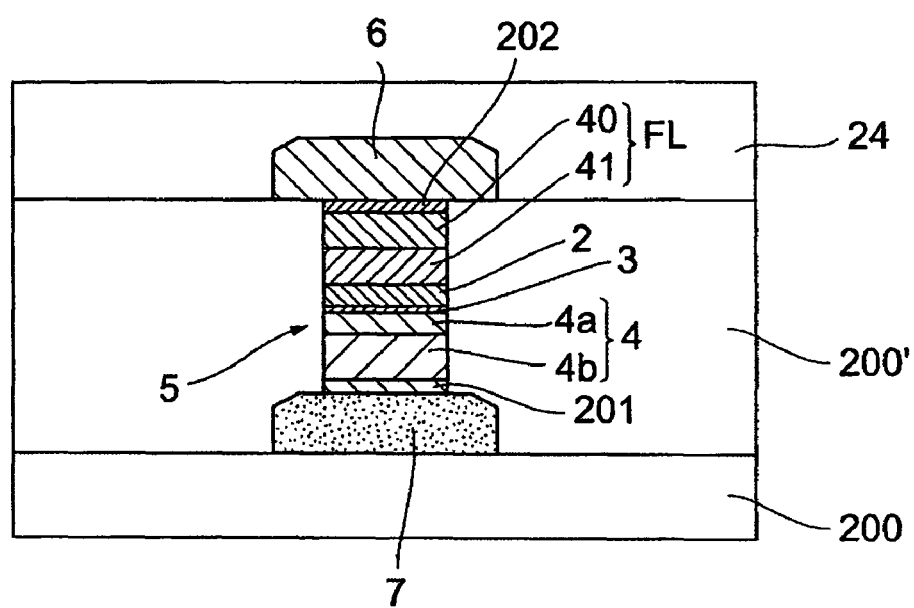
FIG. 14 is a drawing for explaining a production method of a magnetic memory.

FIG. 14 is a sectional view of a storage part of a type without the magnetic yoke, which can be produced by executing the steps of FIG. 11A to FIG. 11K and thereafter forming the upper insulating layer 24 on the upper line 6 and on the intermediate insulating layer 200'.

What is claimed is:

1. A magnetic memory comprising an array of storage areas,
wherein each of said storage areas comprises:
a first line, a first magnetic field being generated around the first line;
a second line, a second magnetic field being generated around the second line;
a magnetoresistive element disposed directly below the first line and directly above the second line between a midway of the first line and the second line and electrically connected to the midway of the first line and to the second line; and
a spin filter prepared for the magnetoresistive element, so as to change a direction of magnetization of a magnetosensitive layer in the magnetoresistive element by spin injection,
wherein the first and second lines are so arranged that:
in writing of information, directions of an electric current flowing in the first line and in the second line are opposite to each other and the first and second magnetic fields around the first line and around the second line both assist a force to change the direction of magnetization of the magnetosensitive layer by spin injection; and
in reading of information, an electric current flowing in the first line and an electric current flowing in the second line are in the same direction with each other and the first and second magnetic fields around the first line and around the second line cancel each other in the magnetosensitive layer,
wherein the magnetoresistive element is arranged so as to receive the first and second magnetic fields generated by the first line and the second line, the first line and the second line being parallel to each other
wherein each of said storage areas comprises:
a transistor having a gate, a source and a drain, one of the source and the drain being connected to the second line arranged under the magnetoresistive element, and
said magnetic memory further comprising:
a switching circuit having a word line connected to the gate of the transistor; and
a control circuit for controlling a current direction in the first line opposite to a current direction in the second line.

2. The magnetic memory according to claim 1, wherein each of the storage areas comprises a magnetic yoke surrounding the magnetoresistive element.

3. The magnetic memory according to claim 1, wherein the magnetoresistive element is a TMR element having an insulating layer between the magnetosensitive layer and a first fixed layer.

4. The magnetic memory according to claim 3, wherein at a position of the magnetoresistive element, the first and second lines extend in a direction perpendicular to a direction of magnetization of the fixed layer and to a thickness direction thereof.

5. The magnetic memory according to claim 3,
wherein the spin filter comprises:
a nonmagnetic, electroconductive layer disposed on the magnetosensitive layer; and
a second fixed layer in contact with the nonmagnetic, electroconductive layer,
wherein a direction of magnetization of the second fixed layer is parallel to a direction of magnetization of the first fixed layer.

6. The magnetic memory according to claim 4,
wherein the spin filter comprises:
a nonmagnetic, electroconductive layer disposed on the magnetosensitive layer; and
a second fixed layer in contact with the nonmagnetic, electroconductive layer, wherein a direction of magnetization of the second fixed layer is parallel to a direction of magnetization of the first fixed layer.

7. A magnetic memory comprising an array of storage areas:

wherein each of said storage areas comprises:

a first line, a first magnetic field being generated around the first line;

a second line, a second magnetic field being generated around the second line;

a magnetoresistive element disposed directly below the first line and directly above the second line between a midway of the first line and the second line and electrically connected to the midway of the first line and to the second line; and a spin filter prepared for the magnetoresistive element, so as to change a direction of magnetization of a magnetosensitive layer in the magnetoresistive element by spin injection, wherein the magnetoresistive element is arranged so as to receive the first and the second magnetic fields generated by the first line and the second line, the first line and the second line being parallel to one another wherein each of said storage areas comprises:

a transistor having a gate, a source and a drain, one of the source and the drain being connected to the second line arranged under the magnetoresistive element, and said magnetic memory further comprising:

a switching circuit having a word line connected to the gate of the transistor; and a control circuit for controlling a current direction in the first line opposite to a current direction in the second line.

8. The magnetic memory according to claim 7, wherein each of the storage areas comprises a magnetic yoke surrounding the magnetoresistive element.

9. The magnetic memory according to claim 7, wherein the magnetoresistive element is a TMR element having an insulating layer between the magnetosensitive layer and a first fixed layer.

10. The magnetic memory according to claim 9, wherein at a position of the magnetoresistive element, the first and second lines extend in a direction perpendicular to a direction of magnetization of the fixed layer and to a thickness direction thereof 11. The magnetic memory according to claim 9,
wherein the spin filter comprises:

a nonmagnetic, electroconductive layer disposed on the magnetosensitive layer; and a second fixed layer in contact with the nonmagnetic, electroconductive layer, wherein a direction of magnetization of the second fixed layer is parallel to a direction of magnetization of the first fixed layer.

12. The magnetic memory according to claim 10,
wherein the spin filter comprises:

a nonmagnetic, electroconductive layer disposed on the magnetosensitive layer; and a second fixed layer in contact with the nonmagnetic, electroconductive layer, wherein a direction of magnetization of the second fixed layer is parallel to a direction of magnetization of the first fixed layer.

13. The magnetic memory according to claim 1, wherein each of the first line and the second line is perpendicular to the word line connected to the gate of the transistor.

14. A magnetic memory comprising an array of storage areas, wherein each of said storage areas comprises:

a first line, a first magnetic field being generated around the first line;

a second line, a second magnetic field being generated around the second line, the first and the second lines extending parallel to each other;

a magnetoresistive element arranged in both of the first and second magnetic fields directly below the first line and directly above the second line between the first and the second lines extending parallel to each other, the second line being arranged under the magnetoresistive element;

a transistor having a gate, a source and a drain, one of the source and the drain being connected to the second line arranged under the magnetoresistive element;

a switching circuit having a word line connected to the gate of the transistor; and a control circuit for controlling a current direction in the first line opposite to a current direction in the second line.

15. The magnetic memory according to claim 14,
wherein said transistor is arranged immediately beneath the magnetoresistive element.

16. The magnetic memory according to claim 14,
wherein magnetic yoke surrounds the magnetoresistive element.

* * * * *